United States Patent
Maruyama et al.

(10) Patent No.: US 8,404,496 B2
(45) Date of Patent: Mar. 26, 2013

(54) METHOD OF TESTING A SEMICONDUCTOR DEVICE AND SUCTIONING A SEMICONDUCTOR DEVICE IN THE WAFER STATE

(75) Inventors: Shigeyuki Maruyama, Kawasaki (JP); Yasuyuki Itoh, Kawasaki (JP); Tetsurou Honda, Kawasaki (JP); Kazuhiro Tashiro, Kawasaki (JP); Makoto Haseyama, Kawasaki (JP); Kenichi Nagashige, Kawasaki (JP); Yoshiyuki Yoneda, Kawasaki (JP); Hirohisa Matsuki, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 687 days.

(21) Appl. No.: 11/439,119

(22) Filed: May 24, 2006

(65) Prior Publication Data

US 2006/0279003 A1 Dec. 14, 2006

Related U.S. Application Data

(62) Division of application No. 09/577,932, filed on May 25, 2000, now Pat. No. 7,112,889.

(30) Foreign Application Priority Data

Nov. 11, 1999 (JP) .................................... 11-321590

(51) Int. Cl.
*G01R 31/26* (2006.01)

(52) U.S. Cl. ............ 438/15; 438/17; 438/110; 438/113; 438/114; 279/457; 279/684; 279/686; 279/700; 279/E21.53

(58) Field of Classification Search .................. 438/125, 438/460, 461, 462, 463, 464, 465, 15, 17, 438/110, 113–114, 770; 257/737, 778, 797, 257/457, 684, 686, 700, 752, 777, 786, E21.53
See application file for complete search history.

(56) References Cited

U.S. PATENT DOCUMENTS

| | | | |
|---|---|---|---|
| 3,627,338 A | 12/1971 | Thompson | |
| 4,693,770 A | 9/1987 | Hatada | |
| 4,906,011 A | 3/1990 | Hiyamizu et al. | |
| 5,381,307 A | 1/1995 | Hertz et al. | |
| 5,414,297 A * | 5/1995 | Morita et al. ................. | 257/620 |

(Continued)

FOREIGN PATENT DOCUMENTS

| | | |
|---|---|---|
| JP | 55-160439 | 12/1980 |
| JP | 01-129432 | 5/1989 |

(Continued)

OTHER PUBLICATIONS

Japanese Office Action mailed Mar. 6, 2007, Application No. 11-321590.

(Continued)

*Primary Examiner* — Evan Pert
*Assistant Examiner* — Mark A Laurenzi
(74) *Attorney, Agent, or Firm* — Westerman, Hattori, Daniels & Adrian, LLP

(57) ABSTRACT

A semiconductor device has an alignment mark which can be recognized by a conventional wafer prober. A redistribution layer connects electrodes of the semiconductor device to electrode pads located in predetermined positions of the redistribution layer. Metal posts configured to be provided with external connection electrodes are formed on the electrode pads of the redistribution layer. A mark member made of the same material as the metal posts is formed on the redistribution layer. The mark member serves as an alignment mark located in a predetermined positional relationship with the metal posts.

2 Claims, 25 Drawing Sheets

U.S. PATENT DOCUMENTS

| | | | |
|---|---|---|---|
| 5,497,258 A | 3/1996 | Ju et al. | |
| 5,554,940 A * | 9/1996 | Hubacher | 324/765 |
| 5,564,682 A | 10/1996 | Tsuji | |
| 5,565,988 A | 10/1996 | Nara et al. | |
| 5,594,273 A | 1/1997 | Dasse et al. | |
| 5,598,036 A | 1/1997 | Ho | |
| 5,657,394 A | 8/1997 | Schwartz et al. | |
| 5,707,051 A | 1/1998 | Tsuji | |
| 5,726,502 A * | 3/1998 | Beddingfield | 257/797 |
| 5,729,315 A | 3/1998 | Takahashi et al. | |
| 5,733,083 A | 3/1998 | Heminger | |
| 5,757,078 A | 5/1998 | Matsuda et al. | |
| 5,807,051 A | 9/1998 | Heminger | |
| 5,880,816 A | 3/1999 | Mimura et al. | |
| 5,883,435 A | 3/1999 | Geffken et al. | |
| 5,899,729 A * | 5/1999 | Lee | 438/460 |
| 5,923,996 A * | 7/1999 | Shih et al. | 438/462 |
| 5,950,070 A | 9/1999 | Razon et al. | |
| 6,016,013 A | 1/2000 | Baba | |
| 6,034,437 A | 3/2000 | Shibata | |
| 6,103,552 A * | 8/2000 | Lin | 438/113 |
| 6,207,477 B1 | 3/2001 | Motooka et al. | 438/113 |
| 6,271,480 B1 | 8/2001 | Yamaguti et al. | |
| 6,280,308 B1 | 8/2001 | Ishikawa et al. | |
| 6,376,049 B1 | 4/2002 | Asai et al. | |
| 6,429,387 B1 * | 8/2002 | Kuribayashi et al. | 174/261 |
| 6,456,099 B1 | 9/2002 | Eldridge et al. | |

FOREIGN PATENT DOCUMENTS

| | | | |
|---|---|---|---|
| JP | 403041716 | * | 7/1989 |
| JP | 01-196856 | | 8/1989 |
| JP | 03029333 A | | 2/1991 |
| JP | 06143073 A | | 5/1994 |
| JP | 07-058191 | | 3/1995 |
| JP | 07-221414 | | 8/1995 |
| JP | 07-335722 | | 12/1995 |
| JP | 08-064725 | | 3/1996 |
| JP | 09-064049 | | 3/1997 |
| JP | 09-107011 | | 4/1997 |
| JP | 09-162120 | | 6/1997 |
| JP | 09155747 A | | 6/1997 |
| JP | 09-174364 | * | 7/1997 |
| JP | 09-260443 | | 10/1997 |
| JP | 411260768 | * | 3/1998 |
| JP | 10-107131 | | 4/1998 |
| JP | 10-128634 | | 5/1998 |
| JP | 10-335205 | | 12/1998 |
| JP | 11-204576 | | 7/1999 |
| JP | 11-233390 | | 8/1999 |
| JP | 11-260768 | | 9/1999 |
| WO | WO 98/02919 | | 1/1998 |

OTHER PUBLICATIONS

Korean Office Action dated Mar. 4, 2007, Application No. 519980964415.

Office Action from Japanese Patent Office for Application No. 11-321590 mailed Jun. 29, 2004.

Japanese Office Action mailed Oct. 17, 2006 for Application No. 11-321590.

* cited by examiner

FIG.2
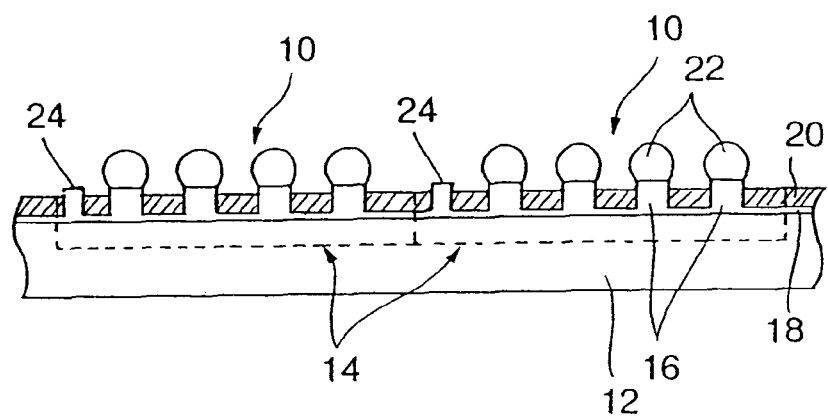
FIG.3A
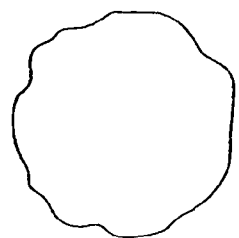
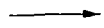
FIG.3B
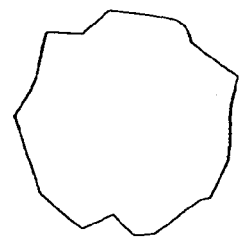

FIG.4A 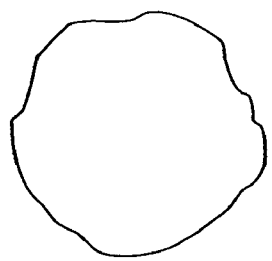 FIG.4B 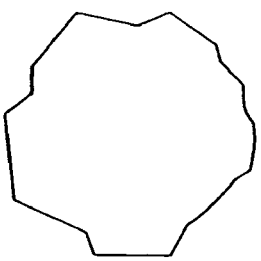
FIG.5A 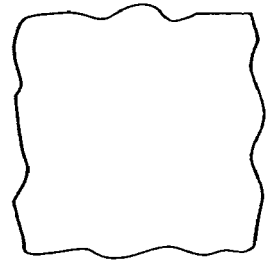   FIG.5C 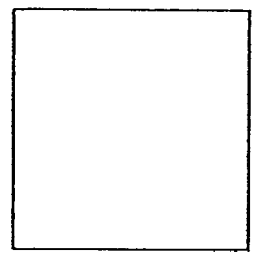
FIG.5B 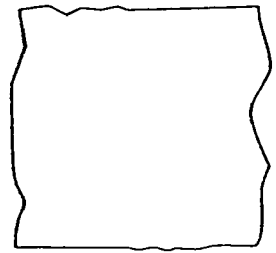 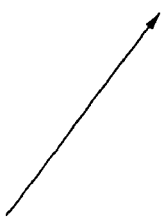

CHANGE RATE IS LARGER THAN LADIUS OF CURVATURE

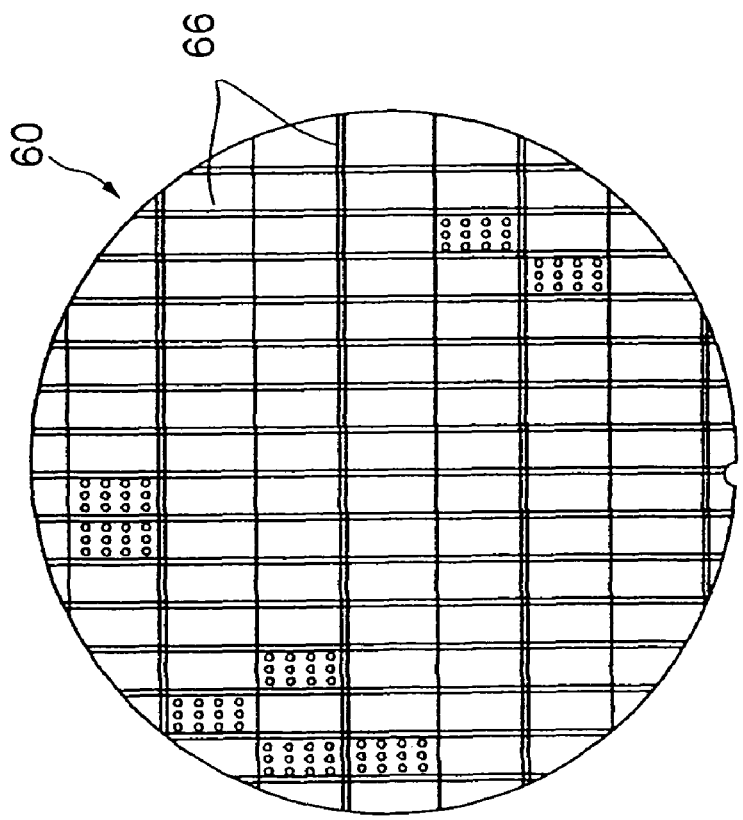
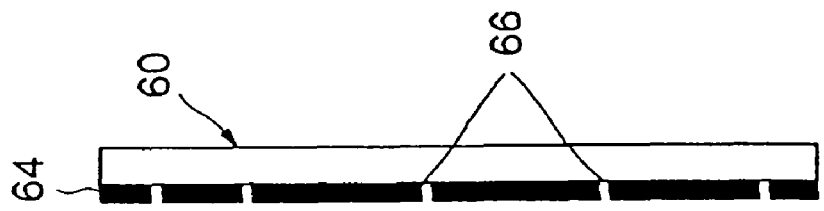

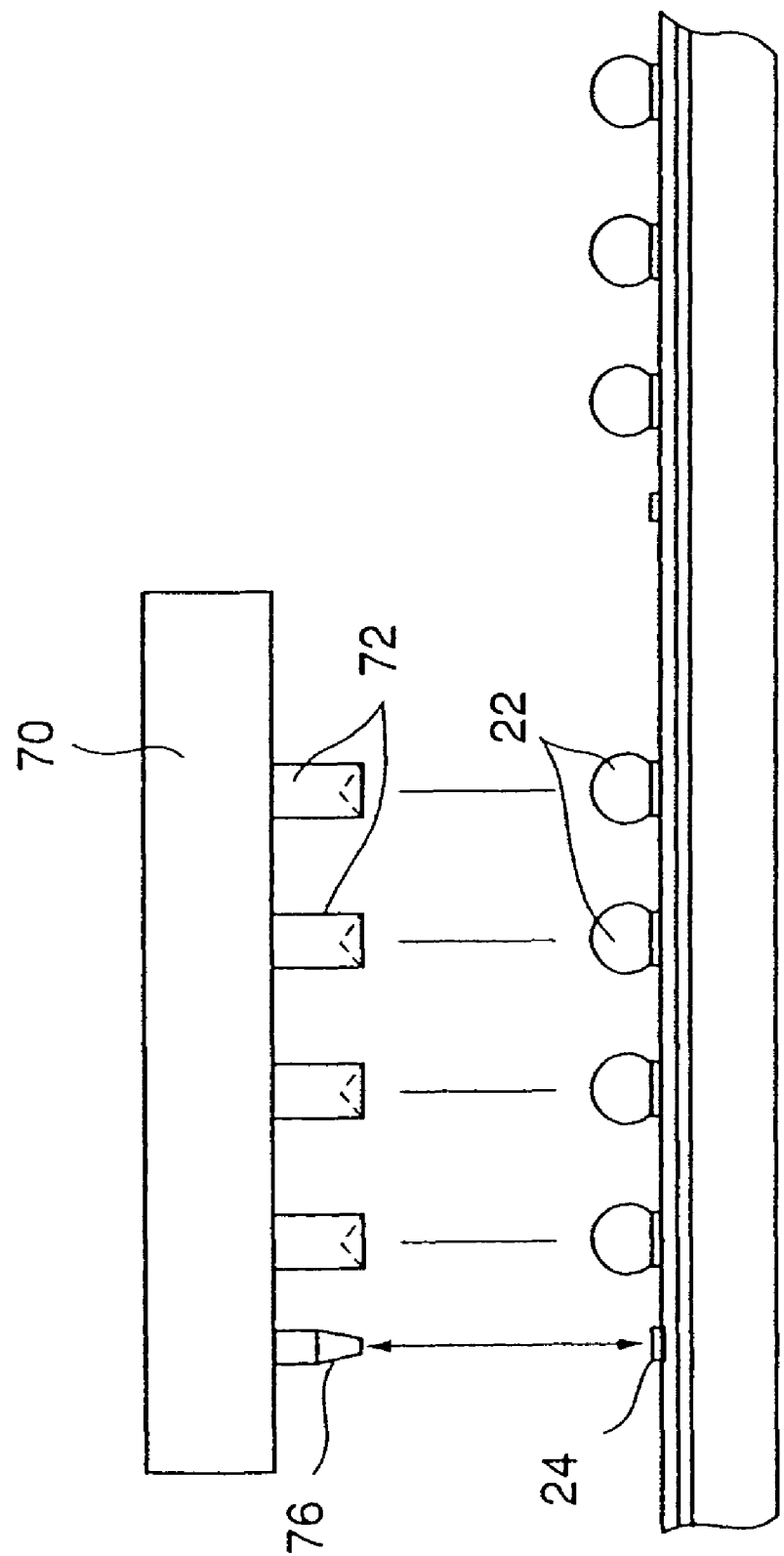

FIG.30A
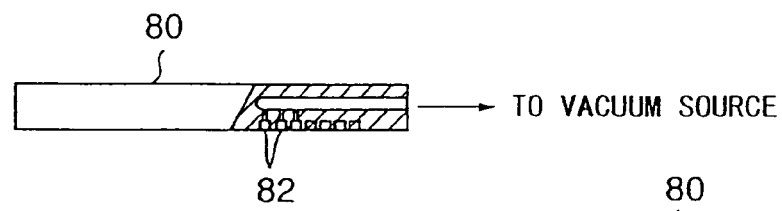
FIG.30B
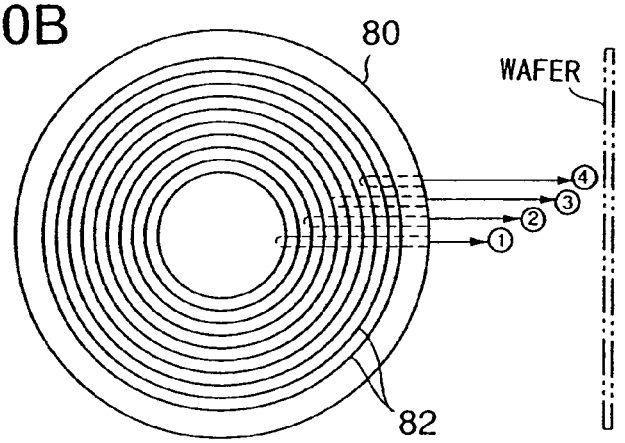
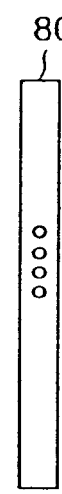
FIG.30C
FIG.31
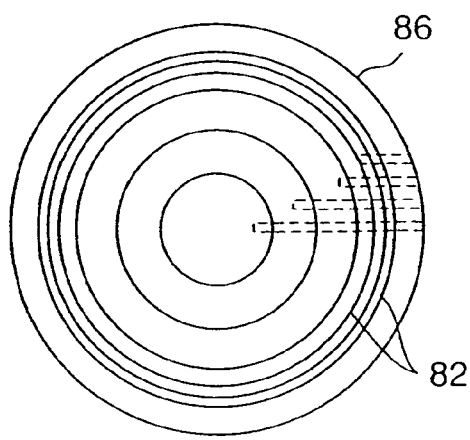

METHOD OF TESTING A SEMICONDUCTOR DEVICE AND SUCTIONING A SEMICONDUCTOR DEVICE IN THE WAFER STATE

CROSS-REFERENCE TO RELATED APPLICATIONS

This application is a Divisional application of application Ser. No. 09/577,932, filed May 25, 2000 now U.S. Pat. No. 7,112,889, the entire disclosure of which is hereby incorporated by reference.

BACKGROUND OF THE INVENTION

1. Field of the Invention

The present invention generally relates to semiconductor devices and, more particularly, to a semiconductor device which is encapsulated together with other semiconductor devices before being divided into individual semiconductor devices and is tested by being positioned in a test apparatus by image recognition.

2. Description of the Related Art

A semiconductor device formed by packaging a semiconductor chip is subjected to a semiconductor test for checking its operation at the end of its manufacturing process. When such a semiconductor device is loaded on a semiconductor test apparatus in the test process, the semiconductor device is positioned in the semiconductor test apparatus by referring to an outer configuration of the semiconductor device. Such a positioning operation is performed by a handling device. That is, the semiconductor device subjected to the test is positioned by referring to the outer configuration of the package when mounting the semiconductor device to a socket of the test apparatus.

In recent years, miniaturization of semiconductor chips has greatly advanced, and, therefore, the package size of the semiconductor devices has also been reduced. Accordingly, when the handling device is used for positioning the semiconductor device by referring to an outer configuration, the handling device must be altered every time the package size is changed.

Additionally, semiconductor chips having a package size the same as the size of the semiconductor chip have been increased. Thus, an altering jig must be prepared for each kind of semiconductor chip. Additionally, even when the same kind of semiconductor chip is used, the handling device must be altered each time the size of the semiconductor chip is reduced. Accordingly, a cost of the alteration of the handling device is markedly increased.

Additionally, in association with miniaturization of the semiconductor chips, the pitch of the electrodes of a semiconductor device has been reduced. Accordingly, in the method in which the positioning is performed by referring to an outer configuration of the semiconductor device, a desired accuracy of positioning may not be achieved.

Under the above-mentioned circumstances, it has been suggested to test a plurality of semiconductor devices in a state in which the semiconductor chips are packaged in an integrally connected state. That is, a plurality of semiconductor devices formed on a wafer are cut out in an integral form, and are packaged simultaneously so as to form a plurality of semiconductor devices at the same time. In this case, an outer configuration of the semiconductor device can be standardized in a certain degree.

Additionally, it has been suggested to position the terminals of the semiconductor device relative to the socket (or probe) of the test apparatus by a method using image recognition instead of the method using an outer configuration of the semiconductor device as a reference. However, the method using image recognition is not suitable for a case in which a large number of semiconductor devices are tested in a single test process. In a case of testing semiconductor memory devices, 32 to 64 pieces of semiconductor devices are tested in a single test process. Considering a test cost, it is not practical to position each of such a large number of semiconductor devices on an individual device basis by using the method using image recognition. That is, the test apparatus must be provided with 32 to 64 image recognition devices and position correcting mechanisms that can deal with the respective image recognition devices, thereby increasing the size and complexity of the test apparatus.

In this case, the number of image recognition devices and the position correcting mechanisms provided in the handling device can be reduced by forming a plurality of memory chips in an accurately connected state and testing the plurality of memory chips while positioning the memory chips by using the image recognition instead of testing after being divided into individual memory chips.

As an example of the above-mentioned method, it is suggested to test the semiconductor chips formed on a wafer before being cut out into individual memory devices. That is, a plurality of semiconductor devices that are encapsulated in a wafer state, that is, a plurality of semiconductor devices packaged in a wafer level are subjected to a test before being divided into individual semiconductor devices. Alternatively, a plurality of semiconductor devices are cut out in integral form, and are subjected to a test. In such a case, a wafer prober (image recognition apparatus) corresponding to the integrated form of the plurality of semiconductor devices must be prepared and attached to the handling device. Alternatively, a position recognition device may be provided to the handling device instead of the wafer prober.

However, considering a cost spent on the handling device, it may be an optimum method to test the wafer-level packaged semiconductor devices in the wafer state.

In a so-called bear wafer test in which semiconductor chips are tested in a wafer state, a wafer prober is used. When the wafer-level packaged semiconductor chips are recognized by a conventional wafer prober, there are problems A) through D) as described below. In the following description, the problems are related to a case in which chip size package (CSP) semiconductor devices are used as the wafer-level packaged semiconductor devices.

A) It is difficult to recognize the position of each CSP by the recognizing device of the prober.

A-1) It is difficult to directly recognize the terminals of a semiconductor device.

a) Each of the terminals provided in the CSP is larger than an electrode pad formed on the semiconductor chip. Accordingly, the terminal of the CSP cannot be covered by the recognition area or range of a regular prober, and, thereby, it is difficult to recognize the terminal of the CSP.

b) It is difficult to recognize a terminal having a spherical shape such as a solder ball which is a typical terminal provided to the CSP. That is, since such a spherical terminal lacks a flat part, it is difficult to bring the terminal into focus.

c) Since the height of the terminals vary in a large range (about 50 µm), the terminals are not appropriate for a reference of alignment.

A-2) There is no mark for recognition other than a terminal.

There is no mark on the surface of the CSP, which mark is positioned at a known distance from a terminal.

A-3) There is a limitation with respect to a cost to provide a mark and an accuracy of positioning of the mark when the mark is provided on the surface of the CSP for recognition of position.

As a means for providing a position recognition mark on the surface of the CSP, there is a method to provide a mark by a stamp. However, it is difficult to provide the mark at a predetermined position relative to electrodes provided on the surface of the CSP with a high accuracy. Additionally, since the stamp process is added, a manufacturing cost is increased.

A-4) A cost is increased when the recognition area or range of the prober is enlarged so as to recognize a large terminal.

A description will be given of a method for recognizing a mark by a conventional wafer prober.

The maximum recognition area or range of an alignment mark recognition apparatus provided to a conventional prober is in the rage of 200 μm to 300 μm Generally, the recognition area is defined as a square having a side of about 200 μm. If the size of the mark to be recognized is less than ½ of the recognition area or range, a high recognition rate can be achieved. That is, if the size of the mark is less that ½ of the recognition area or range, the entire mark is within the recognition area or range even when an edge of the mark is at the center of the recognition area or range. Thus, a high recognition rate can be achieved.

The conventional wafer prober is configured to recognize an electrode pad provided on a semiconductor chip. The electrode pad generally has a square shape having a side of about 100 μm. Accordingly, the recognition area or range of the recognition apparatus of the conventional prober has a square shape having a side of about 200 μm.

As a method for recognizing the electrode pad, a pattern matching method is used. Generally, the recognition area or range of 200 μm-square is divided into 16 square areas each having a side of 50 μm so that a comparison is performed with a reference pattern on an individual divided-area basis.

If the shape of the mark does not vary, an arbitrary shape including a circle can be used. However, if the shape of the mark varies, for example, if there is a broken part in the outer configuration of the mark, a circle mark tends to be erroneously recognized as a different shape. That is, since a circular shape provides a uniform change in the entire outer configuration, it is difficult to find a feature thereof. Accordingly, if there is an imperfect part, the circular shape may be recognized as a different shape. On the other hand, a shape including a straight part can be easily recognized even if there is a partially broken part since the straight part can be easily recognized as a whole. Thus, a recognition rate of a shape having a straight part is high. Additionally, a shape having an edge (corner) can be easily recognized since the edge serves as an inflection point.

B) A probe provided in a probe card of the CSP cannot be recognized by a conventional prober. (The probe card is a card-like member provided with proves which are positioned to contact electrode terminals of the CSP to be tested. The probe card is changed for each CSP to be tested.)

The reason is the same as the reason mentioned in the above item A). That is, the end of the probe provided in the probe card for the CSP is larger than the recognition area or range of the probe recognition apparatus provided in the prober. The diameter of the end of the probe provided in the conventional probe card is normally less than 100 μm. On the other hand, the diameter of the terminal (solder ball) of the CSP is about 400 μm, which cannot be entirely covered by the recognition area or range of the probe recognition apparatus.

C) The wafer on which the CSPs are formed is more difficult to be fixed by suction than a wafer on which the conventional semiconductor chips are formed.

In a case of a plastic mold CSP, the thermal expansion rate of the seal resin is higher than that of the wafer (silicon (Si)). Accordingly, when the wafer returns to a room temperature after being molded at a high temperature, the wafer may deform or warp in a convex shape projecting on the wafer side since the amount of compression of the seal resin is greater than that of the wafer. The deformation becomes particularly large when the thickness of the wafer is small, thereby preventing the wafer from being fixed onto a vacuum chuck table.

D) When there is a burr on the seal resin in the wafer state, the burr may fall off during handing by the handling device. The burrs may accumulate within the handling device.

SUMMARY OF THE INVENTION

It is a general object of the present invention to provide an improved and useful semiconductor device in which the above-mentioned problems are eliminated.

A more specific object of the present invention is to provide a semiconductor device having an alignment mark which can be recognized by a conventional wafer prober.

Another object of the present invention is to provide a method for providing a reference mark used for position recognition, which is suitable for testing semiconductor devices in a wafer state.

In order to achieve the above-mentioned objects, there is provided according to one aspect of the present invention a semiconductor device comprising: a semiconductor element having a plurality of electrodes; a redistribution layer which connects the electrodes of the semiconductor device to electrode pads located in predetermined positions of the redistribution layer; a plurality of metal posts formed on the electrode pads of the redistribution layer, the metal posts being configured to be provided with external connection electrodes; at least one mark member which serves as an alignment mark located in a predetermined positional relationship with the metal posts, wherein the mark member is made of the same material as the metal posts.

According to the above-mentioned invention, since the mark member is located in a predetermined positional relationship with the metal posts on which the external connection terminals such as protruding electrodes are provided, the alignment mark and the protruding electrodes are arranged in the predetermined positional relationship. Accordingly, positions of the protruding electrodes can be determined by recognizing the position of the alignment mark by image recognition. The mark member serving as the alignment mark is formed of the same material as the metal posts. That is, the mark member is formed in the process of forming the metal posts by the same method as the metal posts. Accordingly, there is no need to provide an exclusive process for forming the mark member, thereby simplifying the manufacturing process. Additionally, since the mark member and the metal posts are formed in the same process, the mark member can be located with a highly accurate positional relationship with the metal posts.

Since the mark member can be formed in a shape different from the shape of the metal posts, any shape can be selected for the mark member so that the alignment mark has a shape that can be easily recognized by image recognition. Additionally, the shape of the mark member can be selected from any shapes so that the mark member does not restrict a flow of a seal resin. Further, the mark member can be used as an electrode in a semiconductor test process since the mark member is formed of the same material with the metal posts, which is an electrically conductive material. Thereby, the mark member not only serves as an alignment mark but also provides other functions in the semiconductor test process.

Additionally, there is provided according to another aspect of the present invention a semiconductor device comprising: a semiconductor element having a plurality of electrodes; a redistribution layer which connects the electrodes of the semiconductor device to electrode pads located in predetermined positions of the redistribution layer; and at least one mark member which serves as an alignment mark located in a predetermined positional relationship with the electrode pads, wherein the mark member is made of the same material with the electrode pads.

According to the above-mentioned invention, since the mark member is located in a predetermined positional relationship with the electrode pads on which the external connection terminals such as protruding electrodes are provided, the alignment mark and the protruding electrodes are arranged in the predetermined positional relationship. Accordingly, positions of the protruding electrodes can be determined by recognizing the position of the alignment mark by image recognition. The mark member serving as the alignment mark is formed of the same material as the electrode pads. That is, the mark member is formed in the process of forming the electrode pads by the same method as the electrode pads. Accordingly, there is no need to provide an exclusive process for forming the mark member, thereby simplifying the manufacturing process. Additionally, since the mark member and the electrode pads are formed in the same process, the mark member can be located with a highly accurate positional relationship with the electrode pads.

Since the mark member can be formed in a shape different from the shape of the electrode pads, any shape can be selected for the mark member so that the alignment mark has a shape that can be easily recognized by image recognition. Additionally, the mark member can be used as an electrode in a semiconductor test process since the mark member is formed of the same material with the electrode pads, which is an electrically conductive material. Thereby, the mark member not only serves as an alignment mark but also provides other functions in the semiconductor test process.

Additionally, there is provided according to another aspect of the present invention a method of testing a semiconductor device, comprising the steps of: forming a redistribution layer on the semiconductor device in a wafer state; forming metal posts on the redistribution layer; forming a mark member in a predetermined position on the redistribution layer with respect to the metal posts, the mark member serving as an alignment mark; and performing a semiconductor test while determining positions of electrodes of the semiconductor device by recognizing the alignment mark.

According to the above-mentioned invention, the mark member serving as the alignment mark is formed in the process of forming the semiconductor process in a wafer state. Thus, a plurality of semiconductor devices can be simultaneously tested in a wafer state, thereby simplifying the process for attaching the semiconductor devices to a test apparatus.

Additionally, there is provided according to another aspect of the present invention a method of testing a semiconductor device, comprising the steps of: forming a redistribution layer on the semiconductor device in a wafer state; and encapsulating the wafer by a seal resin while maintaining a periphery of the wafer unsealed, the periphery of the wafer corresponding to an area other than an area in which the semiconductor device is formed.

According to the above-mentioned invention, since the periphery of the wafer remains unsealed, a parting line between an upper die and a lower die of a mold die for molding the seal resin is formed on the upper surface of the wafer. Accordingly, the upper die can be brought into contact with the wafer, which has a relatively high elasticity, thereby preventing formation of a burr. Additionally, if the burr is formed on the upper surface of the wafer, the burr may remain on the upper surface of the wafer and does not fall from the wafer. Accordingly, the semiconductor test apparatus is prevented from being contaminated by the burr.

Additionally, there is provided according to another aspect of the present invention a method of testing semiconductor devices, comprising the steps of: forming a redistribution layer on the semiconductor devices in a wafer state; forming a seal resin layer on the redistribution layer so as to encapsulate the semiconductor devices; forming grooves in the seal resin layer along scribe lines, the grooves extending through the seal resin layer so that a bottom of each of the grooves reaches the wafer; performing a test on the semiconductor devices in the wafer state while recognizing the wafer exposed on the bottom of the groove as a reference position; and separating the wafer into individual semiconductor devices by cutting the wafer along the scribe lines.

According to the above-mentioned invention, the grooves are formed along scribe lines that are used for cutting the wafer. Since the bottom of each of the grooves reaches the wafer, the wafer is exposed in the bottom of each of the grooves. Since the seal resin layer is normally in a dark color (black), but the wafer is normally in a bright color, the bottom of each of the grooves can be easily recognized by image recognition. Accordingly, the wafer having the grooves can be accurately positioned in a test apparatus by using the bottom of each of the grooves without providing an alignment mark on the wafer.

Additionally, the grooves not only serve as alignment marks but also serve as a means for preventing a warp of the wafer. By forming the grooves in the seal resin layer provided on the wafer, the seal resin layer is divided into small pieces. As a result, the wafer is prevented from being deformed, and the wafer can be positively fixed onto the vacuum chuck table.

The grooves can be formed by using a dicing saw, and the wafer after being tested is subjected to a dicing process again so as to be divided into individual semiconductor devices.

Additionally, there is provided according to another aspect of the present invention a method of fixing a wafer onto a vacuum chuck table by suction, comprising the steps of: suctioning a portion of the wafer having a minimum warp so that the portion of the wafer is fixed onto the vacuum chuck table; suctioning a portion of the wafer adjacent to the suctioned portion of the wafer so that the portion of the wafer adjacent to the suctioned portion is fixed onto the vacuum chuck table; and sequentially repeating the suctioning step until an entire wafer is fixed onto the vacuum chuck table by suction.

According to the above-mentioned invention, the wafer is suctioned and fixed from a portion having less deformation. Thus, even if the wafer has a large deformation, the wafer can be positively fixed onto the vacuum chuck table.

Additionally, there is provided according to another aspect of the present invention an apparatus for fixing a semiconductor wafer by suction, comprising: a vacuum chuck table having a plurality of concentric suction grooves; and suction passages connected to the suction grooves, the suction grooves being grouped into a plurality of groups so that each of the suction passages is connected to the suction grooves included in a corresponding one of the groups, wherein a suctioning force is sequentially introduced into each of the suction passages at different timing.

According to the above-mentioned invention, the suction grooves are divided into a plurality of groups, and the suctioning is started from the suction grooves included in the innermost group, and sequentially shifted toward the outermost group. Accordingly, the suctioning is started from an inner part of the wafer whose deformation or warp is smaller than other portion of the wafer and sequentially shifted toward the outer side of the wafer. Thus, if the wafer has large deformation or warp, the wafer can be positively attracted toward the surface of the vacuum chuck table.

Other objects, features and advantages of the present invention will become more apparent from the following detailed description when read in conjunction with the accompanying drawings.

BRIEF DESCRIPTION OF THE DRAWINGS

FIG. 2 is a cross-sectional view of the semiconductor devices according to the first embodiment of the present invention taken along a line II-II of FIG.1;

FIG. 3A is an illustration of a contour of an example of an alignment mark; FIG. 3B is an illustration of a result of image recognition of the alignment mark shown in FIG. 3A;

FIG. 4A is an illustration of a contour of another example of an alignment mark; FIG. 4B is an illustration of a result of image recognition of the alignment mark shown in FIG. 4A;

FIGS. 5A and 5B are illustrations of square alignment marks having a broken part or a deformed part in different positions; FIG. 5C is an illustration of a result of image recognition of the square alignment marks shown in FIGS. 5A and 5B;

FIG. 21A is a plan view of a variation of the wafer shown in FIGS. 20A and 20B; FIG. 21B is a side view of the wafer shown in FIG. 21A;

FIG. 25 is a side view of a probe card positioned above a semiconductor device;

FIG. 30A is a partially cutaway front view of a vacuum chuck table having a plurality of suction grooves all over the suction area; FIG. 30B is a plan view of the vacuum chuck table shown in FIG. 30A; FIG. 30C is a side view of the vacuum chuck table shown in 30A;

FIG. 31 is a plan view of another example of the vacuum chuck table having a plurality of suction grooves;

DETAILED DESCRIPTION OF THE PREFERRED EMBODIMENTS

A description will now be given, with reference to FIGS. 1 and 2, of a first embodiment of the present invention.

Figure 1:
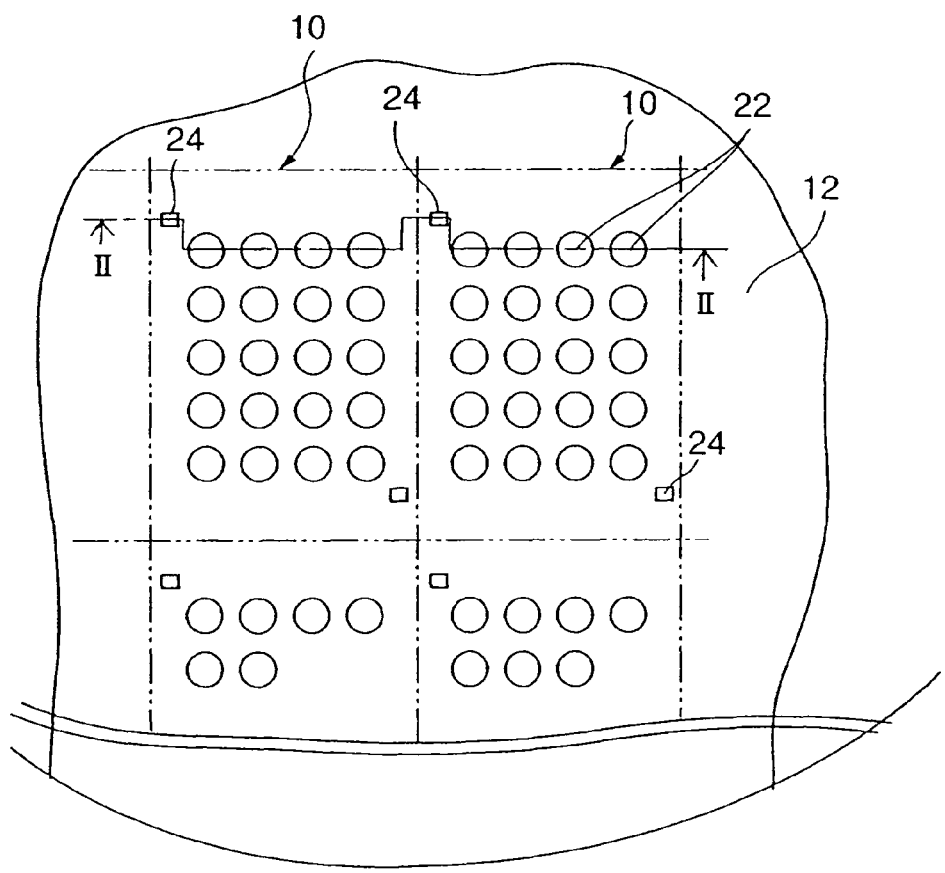
FIG. 1 is a plan view of semiconductor devices according to a first embodiment of the present invention.

FIG. 1 is a plan view of semiconductor devices according to the first embodiment of the present invention. FIG. 2 is a cross-sectional view of the semiconductor devices according to the first embodiment of the present invention taken along a line II-II of FIG. 1.

The semiconductor device 10 according to the first embodiment of the present invention is formed on a silicon wafer 12. A plurality of semiconductor devices 10 are simultaneously formed on the silicon wafer 12. It should be noted that the semiconductor devices 10 shown in FIGS. 1 and 2 are in a wafer state in which the semiconductor wafers 10 are not yet cut out to individual devices. The semiconductor device 10 is formed as a chip size package (CSP) as shown in FIG. 2. That is, the semiconductor device 10 has a redistribution layer 18 on circuit forming areas 14 formed in the semiconductor wafer 12, and a plurality of metal posts (copper posts) 16 are formed on the redistribution layer 18. The metal posts 16 are encapsulated by a seal resin layer 20. A solder ball 22 as a protruding electrode is formed at the top of each of the metal posts 16.

In the above-mentioned structure, electrodes of the circuit forming areas 14 are connected to lands (not shown in the figure) formed in the redistribution layer 18 by conductive patterns (not shown in the figure) also formed in the redistribution layer 18. The metal posts 16 are formed by depositing a metal such as copper by an electroless plating method. After the metal posts 16 are formed, the metal posts 16 are encapsulated by the seal resin layer 20. Thereafter, the solder ball 22 is formed at the end of each of the metal posts 16.

In the semiconductor device 10 according to the present invention, alignment marks 24 serving as alignment marks are formed on the redistribution layer 18 in the step of forming the above-mentioned metal posts 16. That is, the mark members 24 are simultaneously formed in the process of forming the metal posts 16 Accordingly, the mark members 24 are formed of the same material as the metal posts 16.

Since the solder ball 22 is not formed on each of the mark members 24, a top surface of each of the mark members 24 is exposed on the surface of the semiconductor device 10. The top surface of each of the mark members 24 corresponds to the alignment mark, which is used for positioning the semiconductor device 10 in a subsequent test process.

Since the mark members 24 are formed in the same process with the metal posts 16 by using a semiconductor manufacturing process technique, the mark members 24 can be arranged with a high positioning accuracy relative to the metal posts 16. Accordingly, the alignment marks provided by the mark members 24 are arranged with a high positioning accuracy relative to the solder balls 22 formed on the metal posts 16. Thus, the positions of the solder balls 22 can be accurately recognized by recognizing the alignment marks by image recognition in the test process.

A description will now be given of a configuration of each of the mark members 24. The alignment mark is used in a test performed after the semiconductor device 10 is completed in the wafer state. The test is performed by using probes being brought into contact with the electrodes (solder balls 22) of the semiconductor device 10. Accordingly, the semiconductor device 10 must be accurately positioned in the test apparatus. In order to accurately position the semiconductor device 10, the test apparatus is provided with a camera for recognizing the position of the semiconductor device 10. That is, the alignment marks are recognized by the camera so as to determine the positions of the electrodes of the semiconductor device 10. The semiconductor device 10 is moved so that the determined positions of the electrodes match the positions of the probes.

FIG. 3A shows a contour of an example of the alignment mark, and FIG. 3B is a result of image recognition of the alignment mark shown in FIG. 3A. As shown in FIG. 3A, the contour of the alignment mark is not a complete circle since there is a broken part or a deformed part produced in the manufacturing process. When such an alignment mark is recognized by image recognition, the alignment mark is recognized as a polygon as shown in FIG. 3B.

FIG. 4A shows a contour of another example of the alignment mark, and FIG. 4B is a result of image recognition of the alignment mark shown in FIG. 4A. Similar to the example shown in FIG. 3A, the contour of the alignment mark shown in FIG. 4A is not a complete circle since there is a broken part or a deformed part produced in the manufacturing process. When the alignment mark shown in FIG. 4A is recognized by image recognition, the alignment mark is recognized as a polygon as shown in FIG. 4B. It can be appreciated from FIGS. 3B and 4B that the results of recognition differ from each other due to incompleteness of the contour of the alignment mark. That is, although both the alignment marks shown in FIGS. 3A and 4A are formed as a circle, the recognized image (shape) differs from each other due to a broken part or a deformed part in the contour of the alignment marks.

If both the alignment marks shown in FIGS. 3A and 4A show a complete circle, each of the alignment marks is recognized as a circle. However, if there is a broken part or deformed part in different positions, the alignment marks are recognized as different shape since the broken part or the deformed part is regarded as a critical feature of the alignment marks if a radius of curvature of the broken part or the deformed part is smaller than the radius of the circle of the contour of the alignment marks.

On the other hand, an alignment mark having a polygonal shape having a straight part provides a low possibility to be recognized as a different shape. FIG. 5A and 5B show square alignment marks having a broken part or a deformed part in different positions. FIG. 5C shows a result of image recognition of the square alignment marks shown in FIGS. 5A and 5B.

A straight part such as a side of a square can be easily recognized as a straight line even if the straight line includes a winding part since the line including the winding part can be recognized as a straight line based on a part other than the winding part. Accordingly, a polygon such as a square provides a high recognition rate as being recognized as the polygon. That is, a possibility of recognizing a square as other shapes is low. Additionally, a critical feature of a figure lies in its inflection point, and each corner of a polygon is a critical feature of the polygon. That is, the sharper the corner angle, the lower the possibility of presence of a winding part or broken part, which is more critical than the corner. Thus, it can be appreciated that the sharper the corner angle of a figure, the higher the recognition rate of the figure.

Figure 6A:
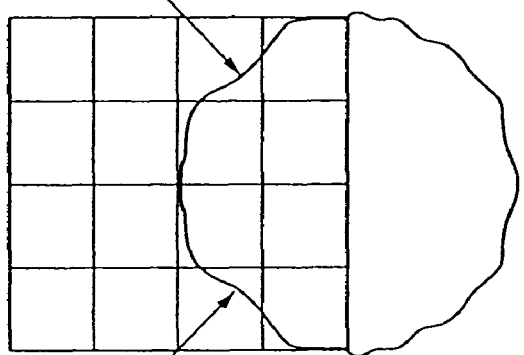
FIG. 6A is an illustration of a contour of a circular alignment mark having a large size.
Figure 6B:
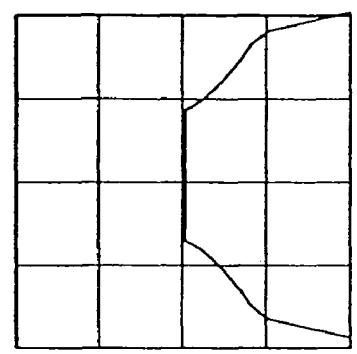
FIG. 6B is an illustration of a result of image recognition of the alignment mark shown in FIG. 6A.

If a circular mark is larger than the recognition area or range as shown in FIG. 6A, a change rate of the contour of the circular mark is low since the radius of curvature is large. Accordingly, if there is a winding part or a broken part, the circular mark may be erroneously recognized as a different shape as shown in FIG. 6B. Additionally, if the entire mark cannot be covered by the recognition area or range, the entire configuration of the mark cannot be recognized which results in erroneous recognition as a completely different shape.

Figure 7A:
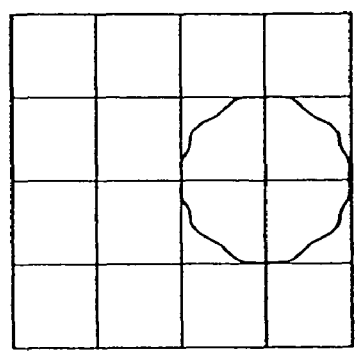
FIG. 7A is an illustration of a contour of a circular alignment mark having a small size.
Figure 7B:
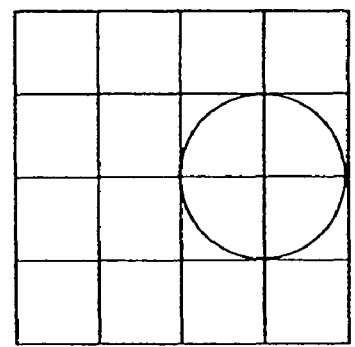
FIG. 7B is an illustration of a result of image recognition of the alignment mark shown in FIG. 7A.

On the other hand, if the mark has a circular shape but the size of the mark is sufficiently smaller than the recognition area or range as shown in FIG. 7A, the mark can be properly recognized as shown in FIG. 7B, and a shift in the position of the mark can also be recognized.

Figure 8A:
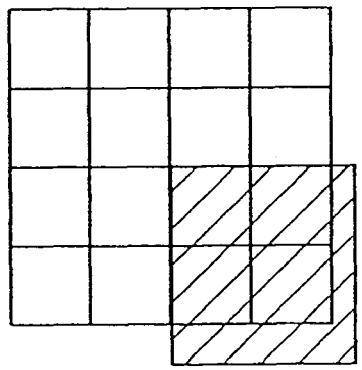
FIGS. 8A and 8B are illustrations of contours of square alignment marks.
Figure 8C:
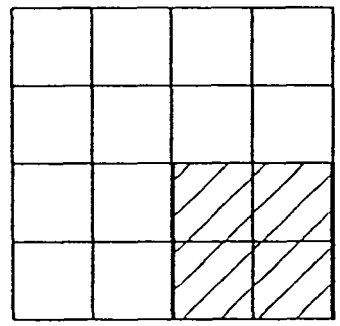
FIG. 8C is an illustration of a result of image recognition of the alignment marks shown in FIGS. 8A and 8B.
Figure 8B:
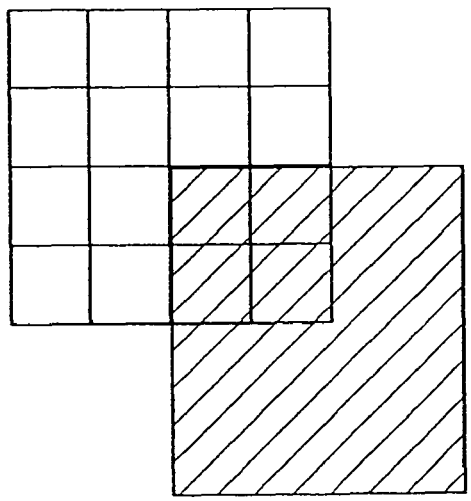
Figure 9:
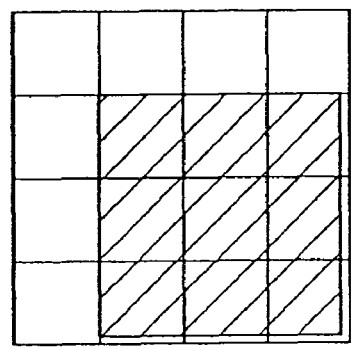
FIG. 9 is an illustration of an alignment mark having a size slightly smaller than three quarters of the size of a recognition area.
Figure 10A:
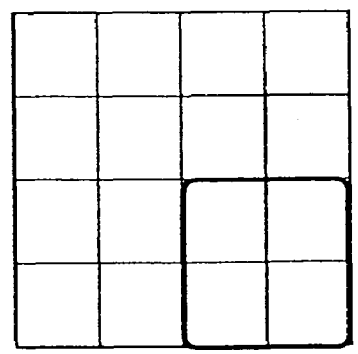
FIG. 10A is an illustration of an alignment mark having a size equal to a quarter of the size of the recognition area.
Figure 10B:
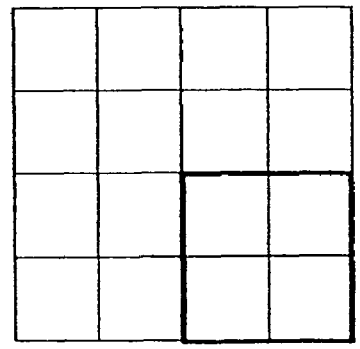
FIG. 10B is an illustration of a result of image recognition of the alignment mark shown in FIG. 10A.

Additionally, even if the mark has a straight part, the mark having a size larger than the recognition area or range may be erroneously recognized as a different shape. That is, for example, the square mark shown in FIG. 8A and another square mark shown in FIG. 8B may be recognized as square marks having the same size as shown in FIG. 8C. This is because, in this case, an outer configuration of the marks is recognized based on two sides of the square. In order to recognize an entire shape of the mark, the size of the mark is preferably about three quarters (¾) of the recognition area or range as shown in FIG. 9. By such an arrangement, the entire mark can be covered by the recognition area or range even if the position of the mark is shifted from the recognition area or range.

According to the above-mentioned reason, it is most preferable that the mark have the size smaller than a quarter (¼) of the recognition area or range and has a straight part such as a square.

In the semiconductor device 10 according to the first embodiment of the present invention as shown in FIGS. 1 and 2, the mark members 24 are formed of the same material as the metal posts 16. That is, the height of each of the mark members 24 must be greater than the thickness of the seal resin layer 20. Since the mark members 24 are formed by plating as the same with the metal posts 16, a bottom area of each of the mark members 24 must have a large area so as to achieve a desired height of each of the mark members 24. That is, the aspect ratio (width/height) of each of the mark members 24 is preferably equal to or greater than 1, more preferably equal to about 2.

The recognition area or range of a camera of a conventional prober is a square having a side of about 200 μm at maximum. Accordingly, if the thickness of the seal resin layer 20 of the semiconductor device 10 is 100 μm, a side of the square corresponding to the horizontal cross-section of each of the mark members 24 is preferably in the range of 100 μm to 150 μm when the preferable aspect ratio (width/height) is taken into consideration. Additionally, due to the fluidity of the seal resin 20 during a molding process, each corner of the square corresponding to the horizontal cross-section of each of the mark members 24 is preferably slightly rounded.

As mentioned above, the size of the horizontal cross-section of each of the mark members 24 is dependent on the height of each of the mark members 24. Thus, if the thickness of the seal resin layer 20 is small, the height of each of the mark members 24 can be small as well. Thereby, the size of the horizontal cross-section of each of the mark members 24 can be reduced as small as a square having a side of 50 μm. In this case, the alignment mark is smaller than the recognition area or range of the prober, thereby improving the recognition rate of the alignment mark.

Figure 11:
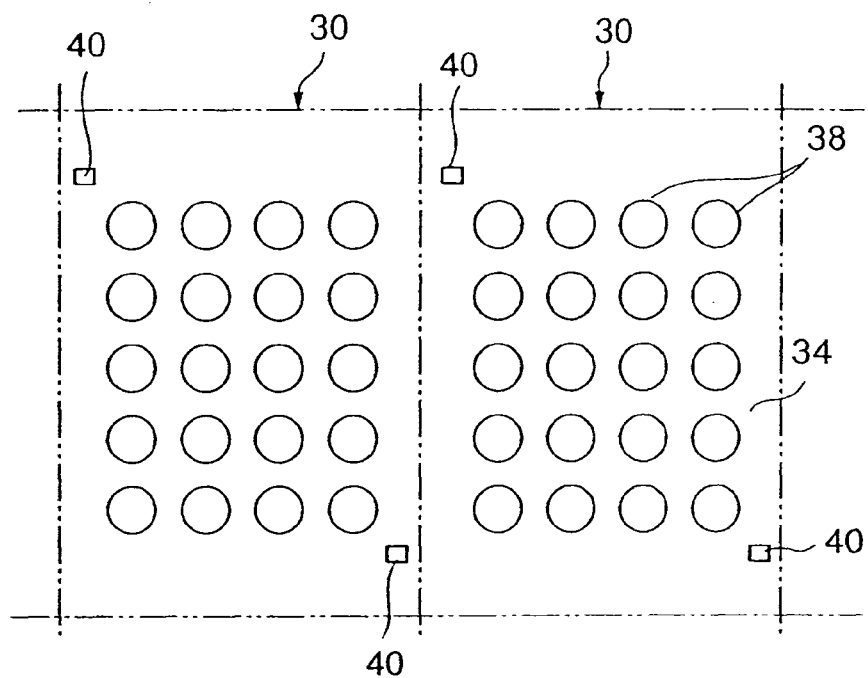
FIG. 11 is a plan view of a semiconductor device according to a second embodiment of the present invention.
Figure 12:
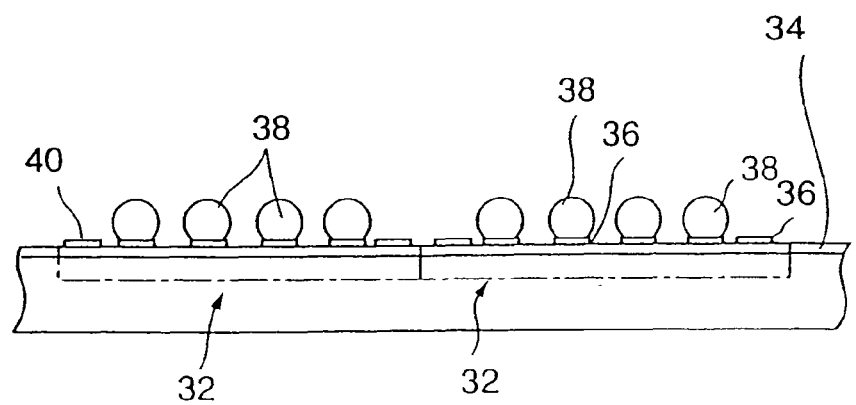
FIG. 12 is a side view of the semiconductor device according to the second embodiment of the present invention.

A description will now be given, with reference to FIGS. 11 and 12, of a second embodiment of the present invention. FIG. 11 is a plan view of a semiconductor device 30 according to the second embodiment of the present invention. FIG. 12 is a side view of the semiconductor device 30 according to the second embodiment of the present invention. It should be noted that FIGS. 11 and 12 show a wafer state in which the semiconductor devices 30 are formed on a wafer and not yet cut out in individual devices.

The semiconductor device 30 comprises: a semiconductor chip 32 formed on a wafer; a redistribution layer 34 formed on the semiconductor chip 32; a plurality of electrode pads 36 formed on the redistribution layer 34; and a plurality of solder balls 38 as protruding electrodes formed on the electrode pads 36. The redistribution layer 34 is provided for redistributing the electrodes of the semiconductor chip 32 to predetermined positions on the redistribution layer 34.

The semiconductor device 30 is a type having no encapsulation. That is, the semiconductor device 30 does not have a seal resin. Accordingly, the semiconductor device 30 is not provided with the metal posts 16 of the semiconductor device 10 according to the first embodiment of the present invention. Thus, mark members 40 serving as alignment marks are formed on the redistribution layer 34.

The mark members 40 are formed by the same method as the electrode pads 36 formed on the redistribution layer 34 for the solder balls 38. In the present embodiment, the electrode pads 36 are formed on a polyimide insulating layer by copper plating. Accordingly, each of the mark members 40 having a thickness of about 10 μm is formed by copper plating. Thus, the configuration of each of the mark members 40 is not dependent on the thickness (height) thereof, and can be formed in a square shape having a side of 100 μm.

Figure 13:
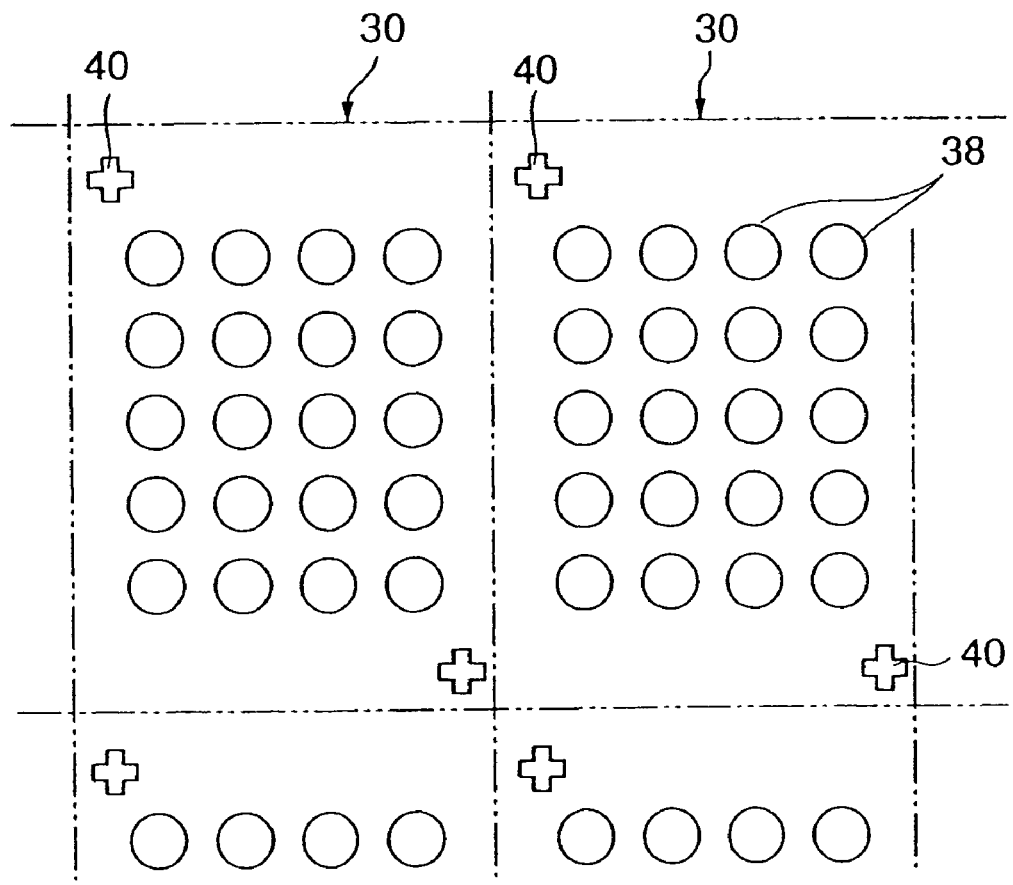
FIG. 13 is a plan view of a variation of the semiconductor device according to the second embodiment of the present invention.

Additionally, since the semiconductor device according to the present embodiment is not encapsulated by a seal resin, there is no need to consider fluidity of the seal resin. That is, a configuration of the alignment mark can be freely selected. FIG. 13 is a plan view of a variation of the semiconductor device 30. In this variation, each of the mark members 40 is cross-shaped. The cross shape can be more easily recognized than the square shape. Thus, the cross-shaped alignment mark can provide a higher recognition rate than the square alignment mark.

It should be noted that although the semiconductor device 30 according to the present embodiment is not encapsulated by a seal resin, the redistribution layer 34 and the electrode pads 40 of the semiconductor device 30 can be produced in the same manner as that of the semiconductor device 10 according to the above-mentioned first embodiment of the present invention. That is, the semiconductor device 10 corresponds to a structure in which the metal posts 16 are formed by plating on the pad electrodes 36 of the semiconductor device 30. Accordingly, the semiconductor device 30 can be produced in the same manner as the semiconductor device 10 before the metal posts 16 are formed. That is, the semiconductor device 30 corresponding to the semiconductor device 10 in a middle state of the manufacturing process. Thus, the semiconductor device 10 can be subjected to a test in the middle of the manufacturing process.

Figure 14:
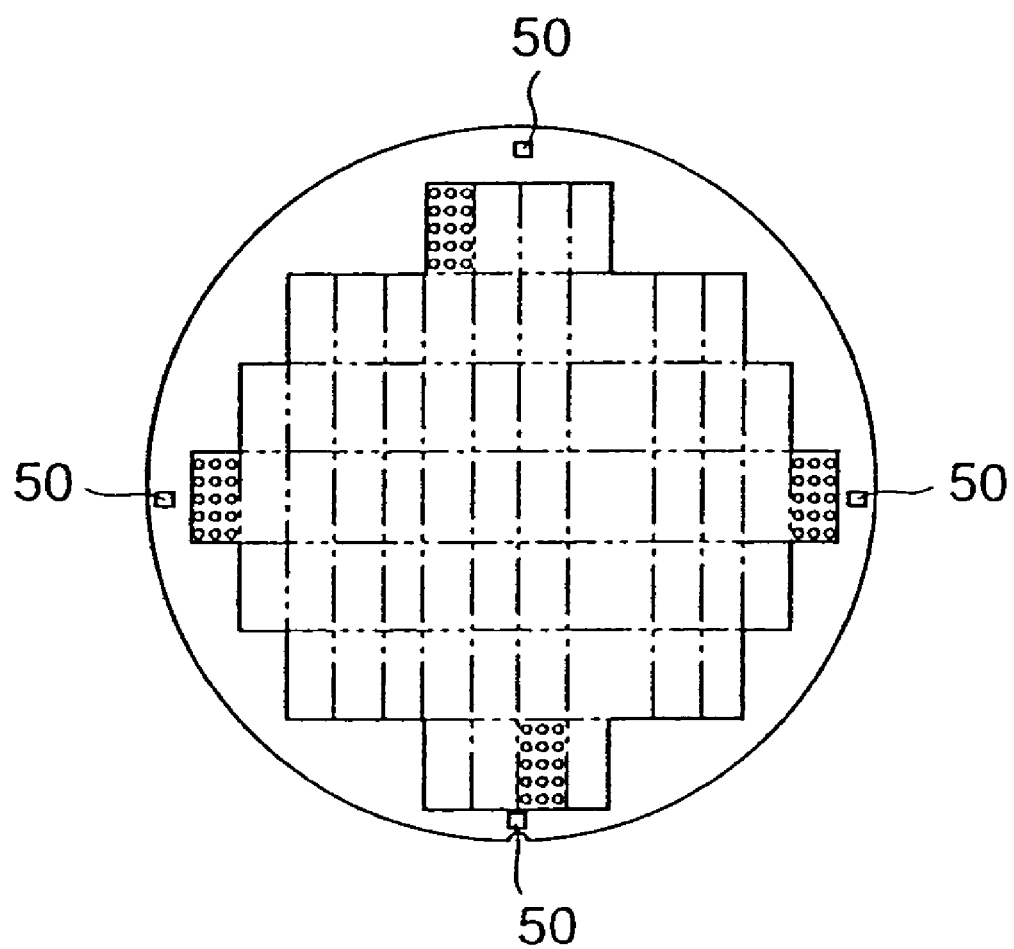
FIG. 14 is a plan view of semiconductor devices according to a third embodiment of the present invention in a wafer state.

A description will now be given, with reference to FIG. 14, of a third embodiment of the present invention. FIG. 14 is a plan view of semiconductor devices according to a third embodiment of the present invention in a wafer state.

In the semiconductor device shown in FIG. 14, four alignment marks are provided on a periphery of a wafer. That is, four mark members 50 serving as alignment marks are provided on the periphery of the wafer. The semiconductor device shown in FIG. 14 has basically the same structure as the semiconductor device 10 or 30. However, the semiconductor device shown in FIG. 14 has protruding electrodes provided in the entire surface thereof, and there is no space to provide a mark member on the surface of the semiconductor device. Accordingly, the mark members 50 are formed on the periphery of the wafer other than the semiconductor devices so that the semiconductor devices are tested in the wafer state.

The mark members 50 shown in FIG. 14 are formed in a square shape having a side of about 150 μm. The semiconductor devices in the wafer state are loaded on the semiconductor test apparatus (prober) in the wafer state, and the alignment marks (mark members 50) are recognized by a camera provided in the test apparatus. Thereafter, the center of the wafer is determined based on a result of the recognition of the mark members 50. The positions of each of the protruding electrodes (solder balls) of each of the semiconductor devices are determined by the center of the wafer so as to place the probes in contact with the respective solder balls to perform a semiconductor test. The semiconductor devices tested in the wafer state are cut out in individual semiconductor devices.

Figure 15A:
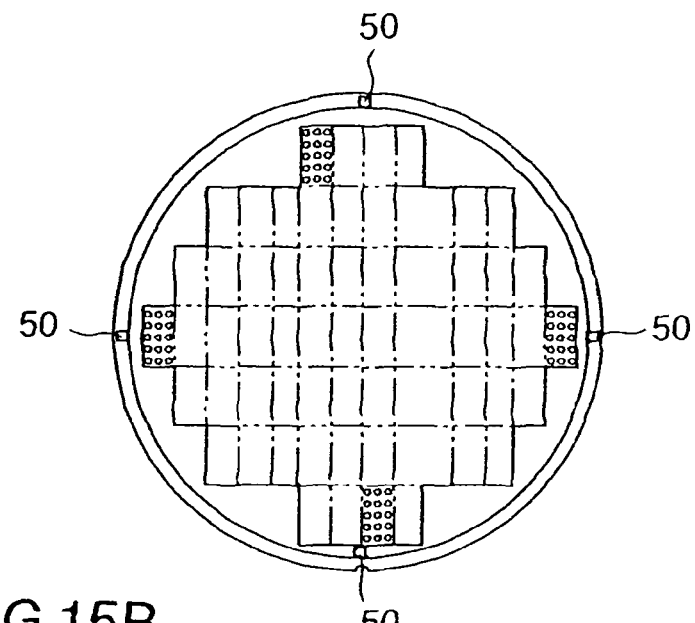
FIG. 15A is a plan view of a wafer on which semiconductor devices are formed according to a fourth embodiment of the present invention.

A description will now be given, with reference to FIGS. 15A and 15B, of a fourth embodiment of the present invention. In the fourth embodiment of the present invention, the semiconductor chip is encapsulated by a seal resin in the wafer state as is the same with the semiconductor device 10 according to the first embodiment of the present invention. However, in the present embodiment, a periphery of the wafer is not encapsulated by the seal resin so as to form alignment marks (mark members 50) on the unsealed periphery of the wafer.

Figure 16:
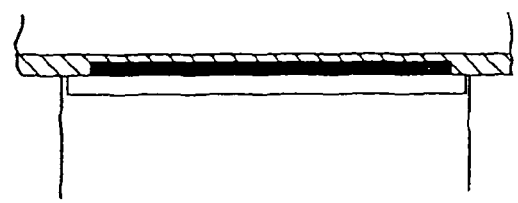
FIG. 16 is an illustration of a mold die for encapsulating the wafer shown in FIGS. 15A and 15B.
Figure 17A:
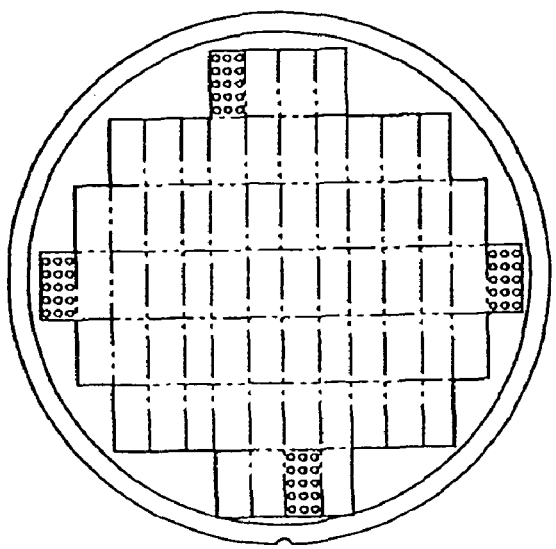
FIG. 17A is a plan view of a wafer having an unsealed periphery.
Figure 17B:
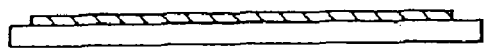
FIG. 17B is a side view of the wafer shown in FIG. 17A.
Figure 18:
FIG. 18 is a side view of a wafer on which semiconductor devices are formed with a periphery of the wafer exposed.

After forming a redistribution layer 52 on semiconductor chips on the wafer and forming metal posts (not shown in the figure) on the redistribution layer 52, the entire wafer is placed on a lower die of a mold die and a seal resin layer is formed by an upper die as shown in FIG. 16. That is, a portion of the upper die, which forms the seal resin layer, has a diameter smaller than the diameter of the wafer so that the bottom surface of the upper die contacts the periphery of the surface of the redistribution layer 52 formed on the wafer. FIG. 17A is the wafer molded by the mold die shown in FIG. 16, and FIG. 17B is a side view of the wafer shown in FIG. 17A. As shown in FIGS. 17A and 17B, the semiconductor chips encapsulated by using the mold die shown in FIG. 16 are encapsulated by a seal resin layer 54 with the periphery of the wafer remaining unsealed.

Figure 15B:
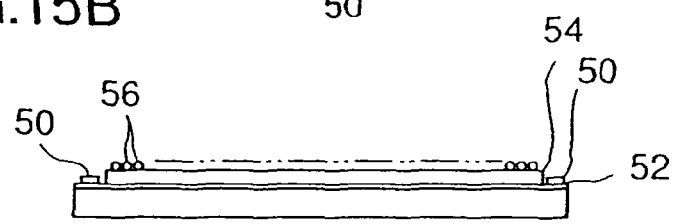
FIG. 15B is a side view of the wafer shown in FIG. 15A.

The semiconductor devices encapsulated in the wafer state are provided with solder balls as protruding electrodes as shown in FIG. 15B. Thereafter, the semiconductor devices are loaded on a semiconductor test apparatus in the wafer state. In the test apparatus, the positions of the solder balls 56 are recognized in the same manner as the semiconductor device shown in FIG. 14 so as to perform a semiconductor test by placing the probes in contact with the respective solder balls 56.

It should be noted that the mark members 50 may be directly formed on the wafer within a portion without forming the redistribution layer 52 on the periphery of the wafer. In order to make the wafer being exposed, a mask layer may be formed, in the forming process of the redistribution layer, on a portion of the wafer so that the redistribution layer is not formed on the portion to be exposed.

When the semiconductor devices in the wafer state that are encapsulated with a periphery remaining unsealed are subjected to the semiconductor test, the following advantages can be achieved. When the semiconductor devices encapsulated in the wafer state are loaded on the semiconductor test apparatus, a parting line between the upper die and the lower die is formed on the side surface of the wafer. In this case, a burr of the seal resin may be formed along the parting line. If the semiconductor devices in the wafer state having such a burr are loaded on the semiconductor test apparatus, the burrs may be removed and accumulate in the test apparatus.

On the other hand, in the method in which the periphery of the wafer remains unsealed, the parting line between the upper die and the lower die is on the upper surface of the wafer. Accordingly, the upper die can be brought into contact with the wafer, which has a relatively high elasticity, thereby preventing formation of the burr. Additionally, if the burr is formed on the upper surface of the wafer, the burr may remain on the upper surface of the wafer and not fall from the wafer. Accordingly, there is an advantage that the semiconductor test apparatus is prevented from being contaminated by the burrs by encapsulating the semiconductor chips with the periphery of the wafer remaining unsealed.

Additionally, a mark or sign indicating a type code of the semiconductor device can be provided on the unsealed periphery of the wafer.

As a method for encapsulating the semiconductor chip in the wafer state with the periphery of the wafer remaining unsealed, a temporary film having a relatively large thickness is applied onto a portion which is to be unsealed. After applying the temporary film, the semiconductor chip in the wafer state is encapsulated by a seal resin, and, thereafter, the temporary film is removed from the wafer.

Figure 19A:
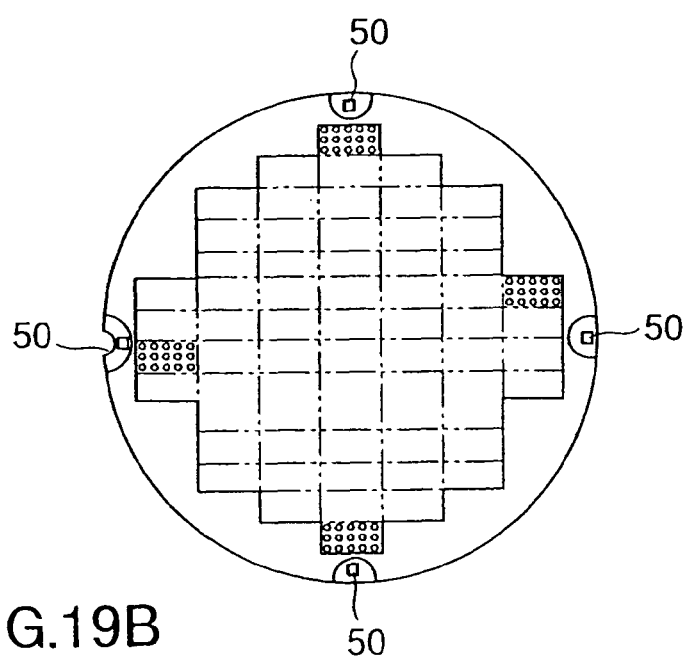
FIG. 19A is a plan view of an example of a wafer on which a plurality of semiconductor devices are formed by being encapsulated by a seal resin and mark members are formed.
Figure 19B:
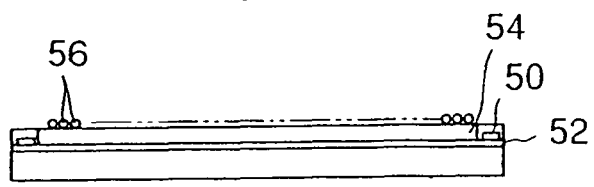
FIG. 19B is a side view of the wafer shown in FIG. 19A.

FIG. 19A is a plan view of an example of a wafer on which a plurality of semiconductor devices are formed by being encapsulated by a seal resin and mark members 50 are formed. FIG. 19B is a side view of the wafer shown in FIG. 19A. In the example shown in FIGS. 19A and 19B, there is an advantage that the thickness of the seal resin layer can be maintained uniform since the excess of the seal resin provided to the semiconductor chips is expelled toward the periphery of the wafer while the alignment marks are provided on the periphery of the wafer.

Figure 20B:
FIG. 20B is a side view of the wafer shown in FIG. 20A.
Figure 20A:
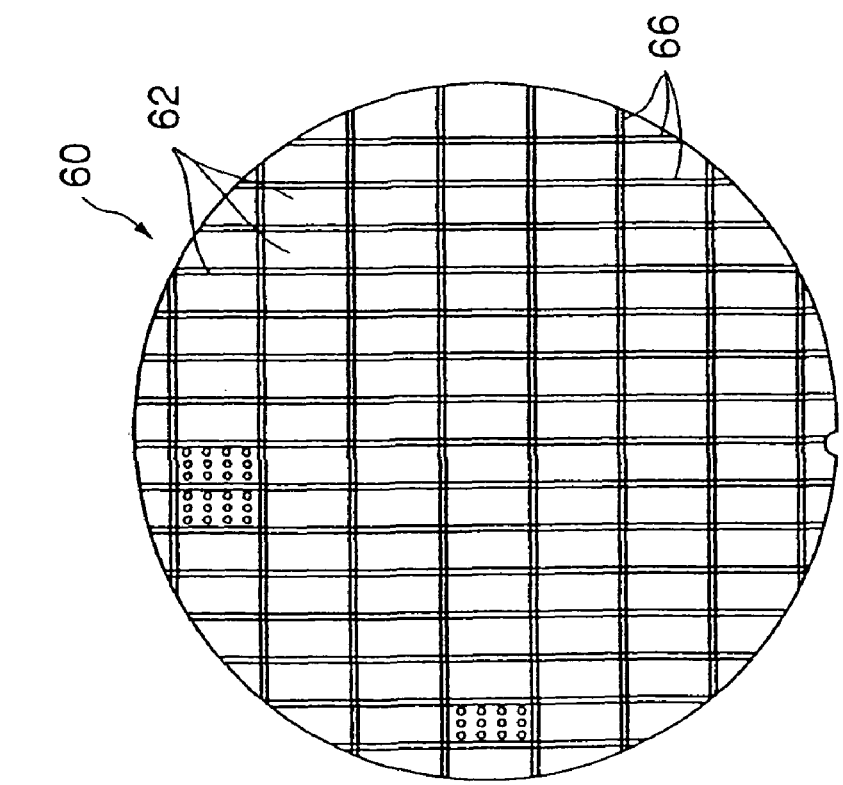
FIG. 20A is a plan view of a wafer used for testing a semiconductor device according to a fifth embodiment of the present invention.

A description will now be given, with reference to FIGS. 20A and 20B, of a fifth embodiment of the present invention. FIG. 20A is a plan view of a wafer used for testing a semiconductor device according to the fifth embodiment of the present invention. FIG. 20B is a side view of the wafer shown in FIG. 20A.

In the method for testing the semiconductor device according to fifth embodiment of the present invention, a redistribution layer is formed on the semiconductor chip 62 before being cut out from the wafer 60, and encapsulated by a seal resin after forming metal posts. Thereafter, grooves 66 are formed along scribe lines that are used for cutting the wafer. The grooves 66 are formed by using a dicing saw. That is, as shown in FIG. 20B, a cutting depth of the dicing saw is set so as to at least exceed the thickness of the seal resin layer 64. Accordingly, the wafer 60 is exposed in the bottom of the grooves 66.

The seal resin layer 64 is a dark color (black), but the silicon wafer 60 is a bright color. Accordingly, the bottom of the grooves 66 formed on the surface of the seal resin layer can be easily recognized by a camera. Especially, the intersection of the grooves 66 can be easily recognized as an alignment mark. Accordingly, the wafer having the grooves 66 can be accurately positioned in the test apparatus by using the intersection of the grooves 66 without providing alignment marks on the wafer.

It should be noted that the wafer 60 shown in FIGS. 20A and 20B is provided with the groove 66 along all of the scribe lines, the groove 66 may be formed along every other scribe lines as shown in FIGS. 21A and 21B.

The grooves 66 do not only serve as alignment marks but also serve as a means for preventing a warp of the wafer 60. When the seal resin layer 64 is formed on the wafer 60, the wafer may warp due to a difference in the thermal expansion rate between the wafer 60 and the seal resin layer 64. Due to the warp of the wafer 60, the wafer 60 deforms in a dish-like shape opening on the seal resin layer 64 side. If the thus-deformed wafer 60 is fixed on a vacuum chuck, the periphery of the wafer 60 may be lifted above the vacuum chuck table. In such a state, air leaks through the lifted portion, and, thereby, the wafer 60 cannot be fixed on the vacuum chuck table.

However, by forming the grooves 66 in the seal resin layer 64 provided on the wafer 60, the seal resin layer 64 is divided into small pieces. As a result, the wafer 60 is prevented from being deformed, and the wafer 60 can be positively fixed onto the vacuum chuck table.

The wafer 60 after being tested is subjected to a dicing process again so as to be divided into individual semiconductor devices. Thereafter, the solder balls as protruding electrodes are formed on the electrode pads exposed on the surface of the seal resin layer 64. It should be noted that the semiconductor devices may be subjected to the test process after forming the grooves 66 and forming the solder balls in the wafer state.

Figure 22A:
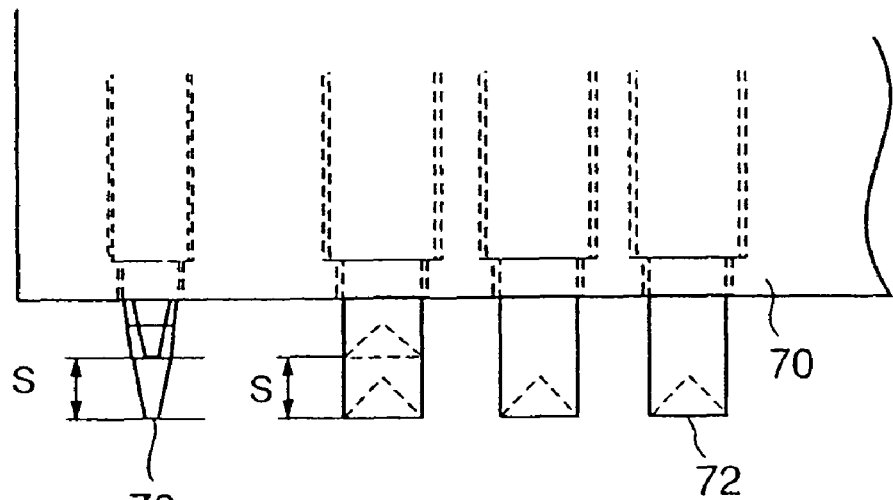
FIG. 22A is a side view of a part of a probe card used in a semiconductor test apparatus.
Figure 22B:
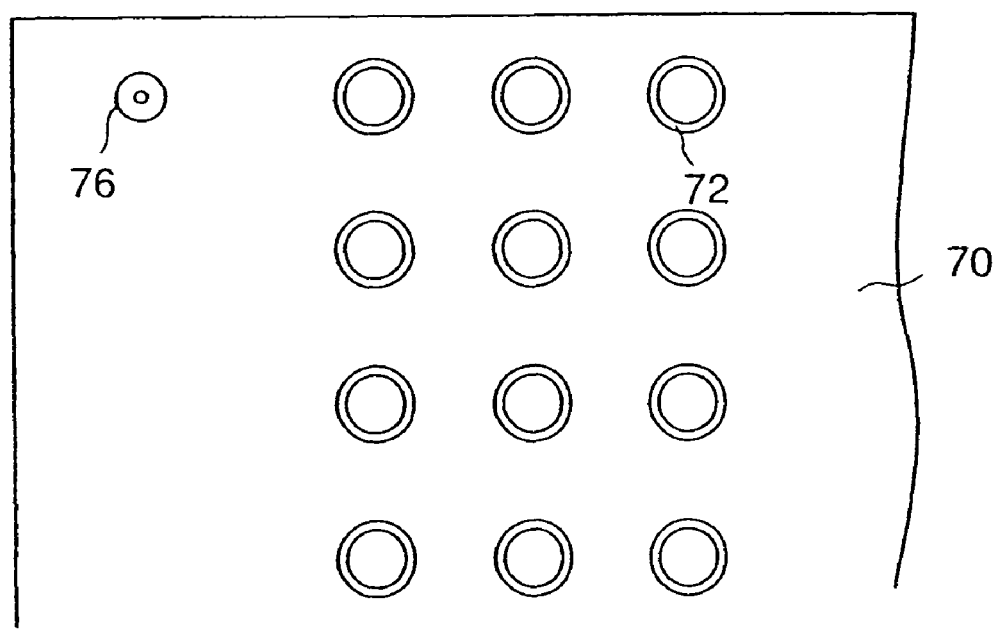
FIG. 22B is a plan view of the part of the probe card shown in FIG. 22A.
Figure 23:
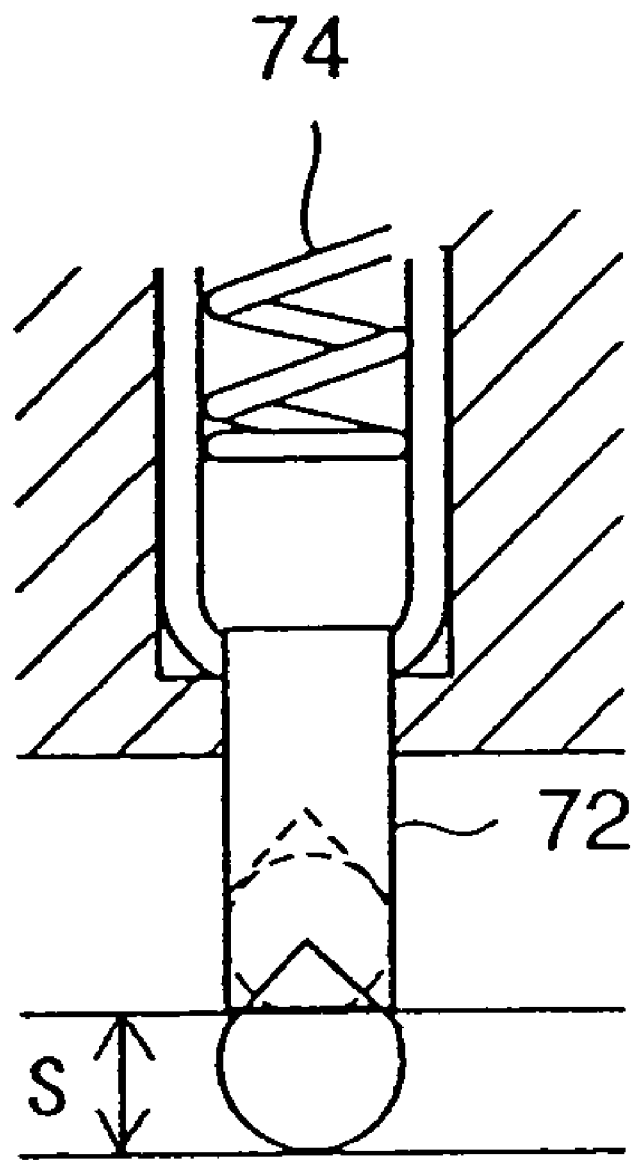
FIG. 23 is a cross-sectional view of a probe provided in the probe card shown in FIGS. 22A and 22B.

A description will now be given of the test apparatus that is used for testing the above-mentioned semiconductor devices. FIG. 22A is a side view of a part of a probe card that is used in a semiconductor test apparatus. FIG. 22B is a plan view of the part of the probe card shown in FIG. 22A. FIG. 23. is a cross-sectional view of a probe provided in the probe card shown in FIGS. 22A and 22B.

The probe card 70 is provided with a plurality of probes 72 at positions corresponding to positions of electrodes (solder balls) of a semiconductor device to be tested. Each of the probes 72 is a vertical spring probe, which is referred to as POGO-PIN. Each of the probes 72 is spring loaded in the extended position by a coil spring 74. Thereby, each of the probes 72 can move in the direction of the longitudinal axis by a distance S as shown in FIG. 22A. Thus, an appropriate contact pressure can be achieved when each of the probes 72 contacts a respective one of the solder balls of the semiconductor device to be tested. Each of the probes 72 has a diameter of about 300 μm so as to easily contact the respective one of the solder balls. A recess corresponding to the solder ball is formed on the end surface of each of the probes 72.

The probe card 70 is also provided with a dummy probe 76 in addition to the probes 72. The dummy probe 76 is also movable in the direction of the longitudinal axis by the distance S. The dummy probe 76 is exclusively provided for recognition of a position of the probe card 70, and does not contact the solder balls. The diameter of the end of the dummy probe 76 is less than 100 μm, and a flat surface having a diameter of 30 μm is formed at the extreme end of the dummy probe 76. The reason for the dummy probe 76 being formed in the above-mentioned mentioned structure is that a camera provided in the prober (test apparatus) cannot recognize the probe 72 having the diameter of 300 μm. Additionally, if there is no flat portion, it is difficult to focus the camera on the probe.

If the probes 72 are also used as the probe for recognizing the position of the probe card 70, dirt may adhere to the probes 72 since the probes 72 contact the protruding electrode. Especially, when solder balls are used for the protruding electrodes, solder may easily adhere onto the probe 72 during a high-temperature test. If dirt adheres to the end of the probe 72, accuracy of recognition of the probe 72 may deteriorate. However, in the present embodiment, the only dummy probe 76 is used for recognition, thereby preventing deterioration of recognition accuracy due to adhesion of dirt to a probe to be recognized. When the dummy probe 76 is configured not to contact the semiconductor device to be tested, erroneous recognition caused by dirt can be almost eliminated.

Figure 24A:
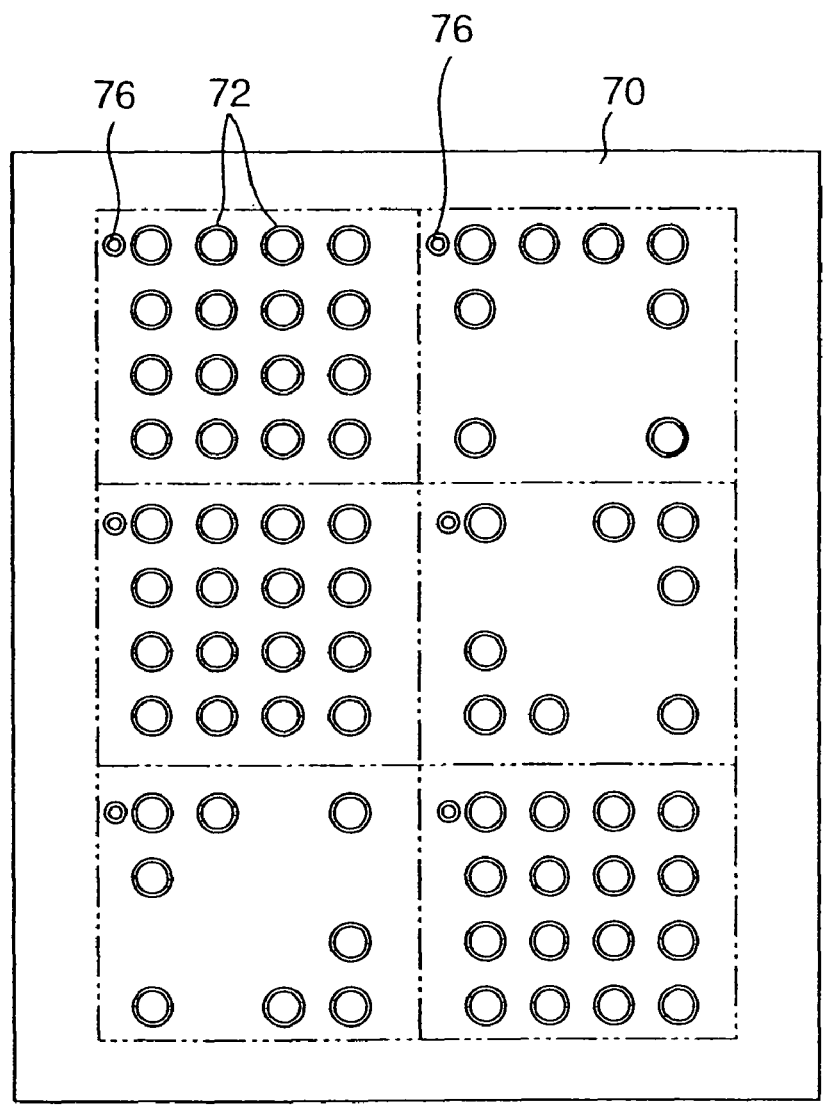
FIG. 24A is a plan view of a probe card configured to simultaneously test six semiconductor devices.
Figure 24B:
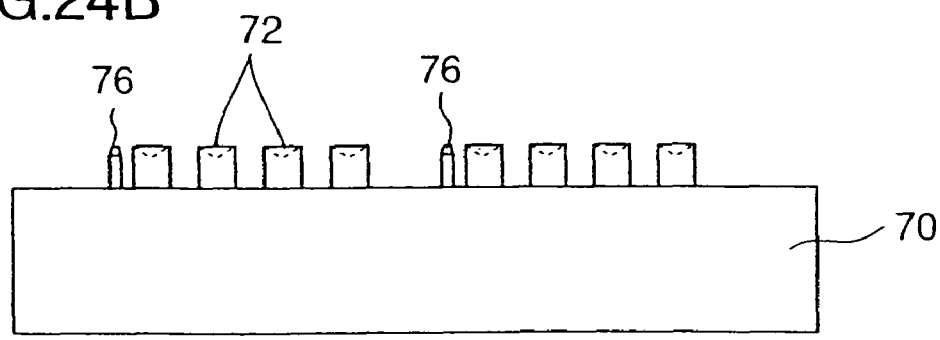
FIG. 24B is a side view of the probe card shown in FIG. 24A.

When a plurality of semiconductor devices are simultaneously tested, there is no need to provide the dummy probe 76 to each of the semiconductor devices. FIG. 24A is a plan view of a probe card configured to simultaneously test six semiconductor devices. FIG. 24B is a side view of the probe card sown in FIG. 24A. As shown in FIG. 24A, the dummy probe 76 is provided to each of the semiconductor devices. However, since the plurality of semiconductor devices are integral with each other and are accurately positioned to each other, only one or two dummy probes 76 need to be provided to the six semiconductor devices.

FIG. 25 is a side view of a probe card positioned above a semiconductor device. In FIG. 25, the dummy probe 76 is located at a position corresponding to an alignment mark of the semiconductor device. It should be noted that the semiconductor device shown in FIG. 25 is identical to the semiconductor device 10 shown in FIG. 1. That is, the positional relationship between the probes 72 and the dummy probe 76 of the probe card 70 is the same as the relationship between the solder balls 22 and the alignment mark (mark member 24) of the semiconductor device 10. Accordingly, the dummy probe 76 matches the alignment mark when the probes 72 of the probe card 70 match the solder balls 22 of the semiconductor device, respectively. Thus, there is no need to input an offset value between the position of the dummy probe 76 and the position of the alignment mark, thereby preventing an input of an incorrect value as the offset value by mistake.

Figure 26A:
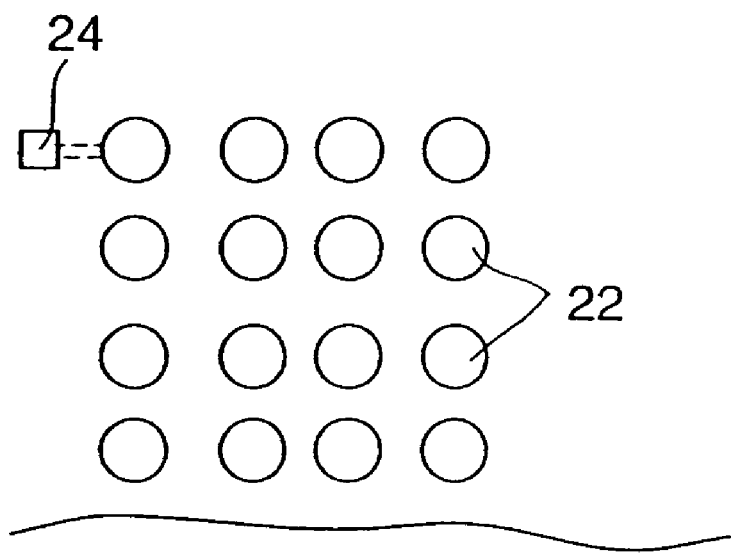
FIG. 26A is a plan view of a semiconductor device having a mark member connected with one of solder balls.
Figure 26B:
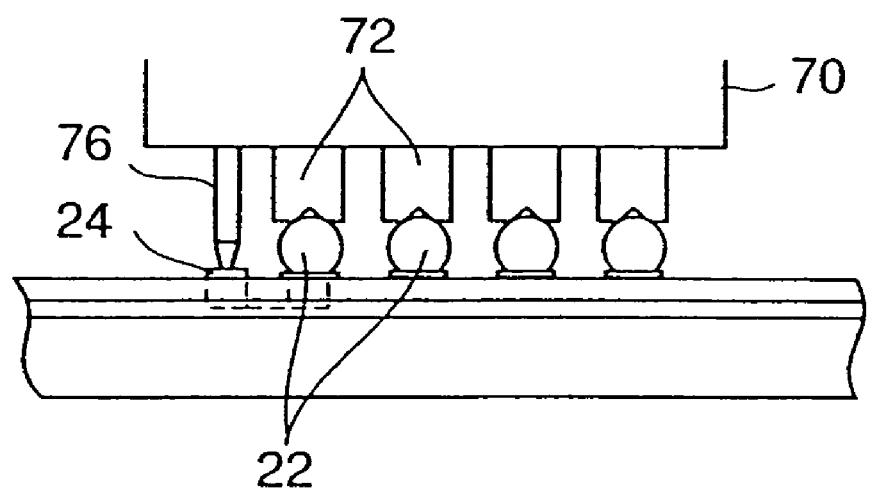
FIG. 26B is a side view of the semiconductor device shown in FIG. 26A in a state in which a probe card is made in contact with the semiconductor device.

Additionally, as shown in FIGS. 26A and 26B, the mark member 24 is electrically connected to one of the electrode pads of the semiconductor device so that a contact of the dummy probe 76 to the mark member 24 can be electrically detected by the test apparatus. For example, the mark member 24 of the semiconductor device may be connected to a GND terminal on the redistribution layer, and the dummy probe 76 of the probe card 70 may be connected to a tester channel or an I/O port of the prober so that an electrical potential of the dummy probe 76 can be detected. In this case, a height of the dummy probe 76 must be adjusted so that the dummy probe 76 appropriately contacts the mark member 24 when the probes 72 contact the respective solder balls 22.

According to the above-mentioned structure, the following effects can be achieved.

1) It can be determined that the probes 72 normally contact the respective solder balls 22 by detecting that the dummy probe 76 electrically contacts with the mark member 24.

2) It can be determined that the probe card 70 is at a lower limit position beyond which the probe card 70 must not approach the semiconductor device by detecting that the dummy probe 76 connects the mark member 24.

Figure 27A:
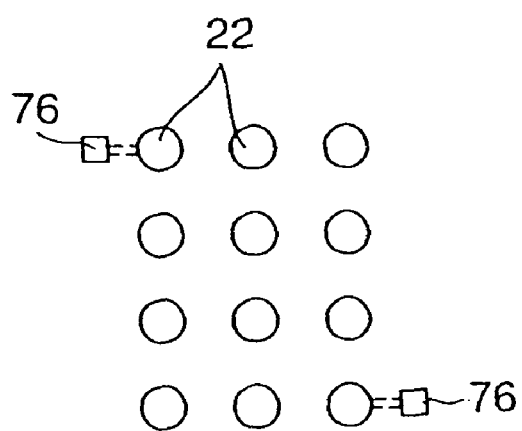
FIG. 27A is a plan view of a semiconductor device having two mark members each of which is connected to one of solder balls.
Figure 27B:
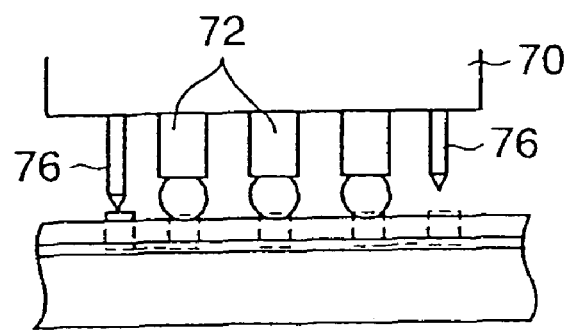
FIG. 27B is a side view of the semiconductor device shown in FIG. 27A in a state in which a probe card is made in contact with the semiconductor device.

3) The effects mentioned in 1) and 2) above can be simultaneously achieved. That is, as shown in FIGS. 27A and 27B, two dummy probes 76 are provided so that one of the dummy probes 76 are located at a height so as to achieve the effect 1) and the other of the dummy probes 76 is located at a height so as to achieve the effect 2). In FIGS. 27A and 27B, the dummy probe on the left side is provided for determining the contact between the probes 72 and the solder balls 22, and the dummy probes 76 on the right side is provided for determining the probe card positioned at the lower limit position.

Figure 28A:
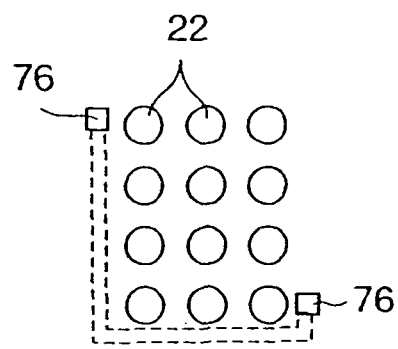
FIG. 28A is a plan view of a semiconductor device provided with two mark members.
Figure 28B:
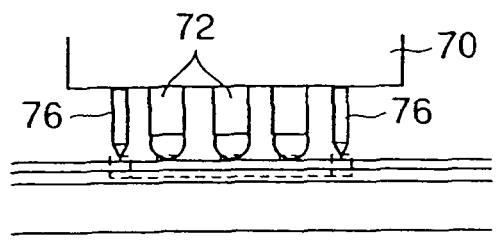
FIG. 28B is a side view of the semiconductor device shown in FIG. 28A.

FIGS. 28A and 28B show an example of the probe card provided with two dummy probes 76. According to the probe card shown in FIGS. 28A and 28B, a parallel level and a positional offset between the probe card and the semiconductor device to be tested can be detected. That is, two mark members 24 are provided to the semiconductor device, and two dummy probes 76 are provided to the probe card 70. The two dummy probes 76 are located at the same height relative to the mark members 24. The two mark members are electrically connected to each other. Accordingly, by detecting whether or not both the two dummy probes 76 simultaneously contact the respective mark members 24, a parallel level and a positional offset (θ-offset) in the rotational direction between the probe card 70 and the semiconductor device can be detected.

Figure 29:
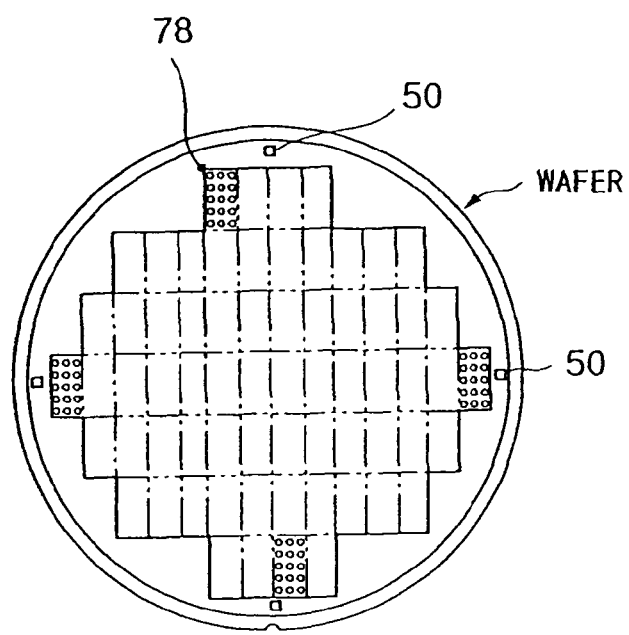
FIG. 29 is a plan view of a wafer provided with a wafer map start point.

FIG. 29 is a plan view of a wafer on which semiconductor devices are formed and provided with a wafer map start point. The wafer shown in FIG. 29 is identical to the wafer shown in FIG. 14 except for the wafer map start point 78 being provided at a predetermined point on the surface of the wafer. The wafer map start point 78 is formed by the same method as the method of forming the alignment marks 50. The wafer map start point 78 is used in a wafer map system in which the positions of the semiconductor devices on the wafer are managed by positional information based on a specific point on the wafer. In this case, the wafer map start point 78 corresponds to the specific point. Since the wafer map start point 78 is formed by the same method as the alignment marks 50, the wafer map start point 78 can be recognized after the semiconductor chips on the wafer are encapsulated by a seal resin. That is, the wafer map system can be effected even when the semiconductor chips are encapsulated.

A description will now be given of a vacuum chuck table provided in a prober (wafer prober) for testing semiconductor devices in the wafer state.

A conventional vacuum chuck table is provided with several concentric suction grooves on the surface thereof with a pitch of more than 5 mm. The suction grooves are connected to a vacuum source so as to attract a wafer toward the surface of vacuum chuck table by suctioning.

The conventional vacuum chuck table is designed to hold fixed a flat wafer. However, as mentioned above, the wafer encapsulated by a seal resin deforms or warps more than a conventional wafer. Such a wafer provided with a seal resin may not become fixed on the conventional vacuum chuck table having several suction grooves. In order to eliminate such a problem, in a case in which the encapsulated wafer is subject to the test, the number of suction grooves formed on the vacuum chuck table is increased by reducing the pitch between the suction grooves so that the encapsulated wafer can be entirely fixed onto the vacuum chuck table.

FIGS. 30A, 30B and 30C are views of a vacuum chuck table 80 having suction grooves 82 all over the suction area. FIG. 30A is a partially cutaway front view of the vacuum chuck table 80; FIG. 30B is a plan view of the vacuum chuck table 80; and FIG. 30C is a side view of the vacuum chuck table 80.

In the vacuum chuck table 80, the suction grooves 82 are arranged with a pitch of 2.5 mm, and each of the suction grooves 82 has a width of 0.5 mm. By arranging the suction grooves 82 with a small pitch such as 2.5 mm, when a wafer having a large deformation or warp is placed on the vacuum chuck table 80, the wafer can be attracted toward the vacuum chuck table 80 sequentially from the suction grooves 82 located on the inner side. Thus, even if the wafer has a large deformation, the entire wafer can be positively fixed on the vacuum chuck table by suctioning through the suction grooves 82.

Additionally, as shown in FIG. 30B, the suction grooves 82 are divided into a plurality of groups, and the suction grooves 82 are connected by a vacuum line to a vacuum source (not shown in the figure) on an individual group basis. In such a structure, the suctioning is started from the suction grooves 82 included in the innermost group, and sequentially shifted toward the outermost group. Accordingly, suctioning is started from an inner part of the wafer whose deformation or warp is smaller than other portion of the wafer and sequentially shifted toward the outer side of the wafer. Thus, if the wafer has large deformation or warp, the wafer can be positively attracted toward the surface of the vacuum chuck table 80.

Particularly, when the encapsulated semiconductor devices are formed in the wafer state, a large deformation or warp is generated in the wafer. When such a wafer is placed on the chuck table 80, a distance between the wafer and the surface of the vacuum chuck table 80 is gradually increased toward the outer side of the wafer. Accordingly, as shown in FIG. 30B, suctioning is started from the innermost grooves and sequentially shifted toward the outermost grooves (in the order of ①→②→③→④) so that a part of the wafer to be attracted is positioned closer to the suction grooves 82. Thus, the wafer having a large deformation or warp can be positively fixed onto the vacuum chuck table 80 by suctioning through the suction grooves 82.

FIG. 31 is a plan view of another example of the vacuum chuck table having a plurality of suction grooves. In the vacuum chuck table 86 shown in FIG. 31, the pitch between the suction grooves 82 is reduced toward the outer side of the wafer. That is, the pitch of the suction grooves 82 located on the inner side of the wafer is set to be equal to 5 mm as is the same as the conventional vacuum chuck table since the deformation or warp of the wafer is small on the inner side of the wafer. On the other hand, the pitch of the suction grooves 82 located on the outer side of the wafer is set to be equal to 2.5 mm since the deformation or warp of the wafer is large on the outer side of the wafer.

Figure 32A:
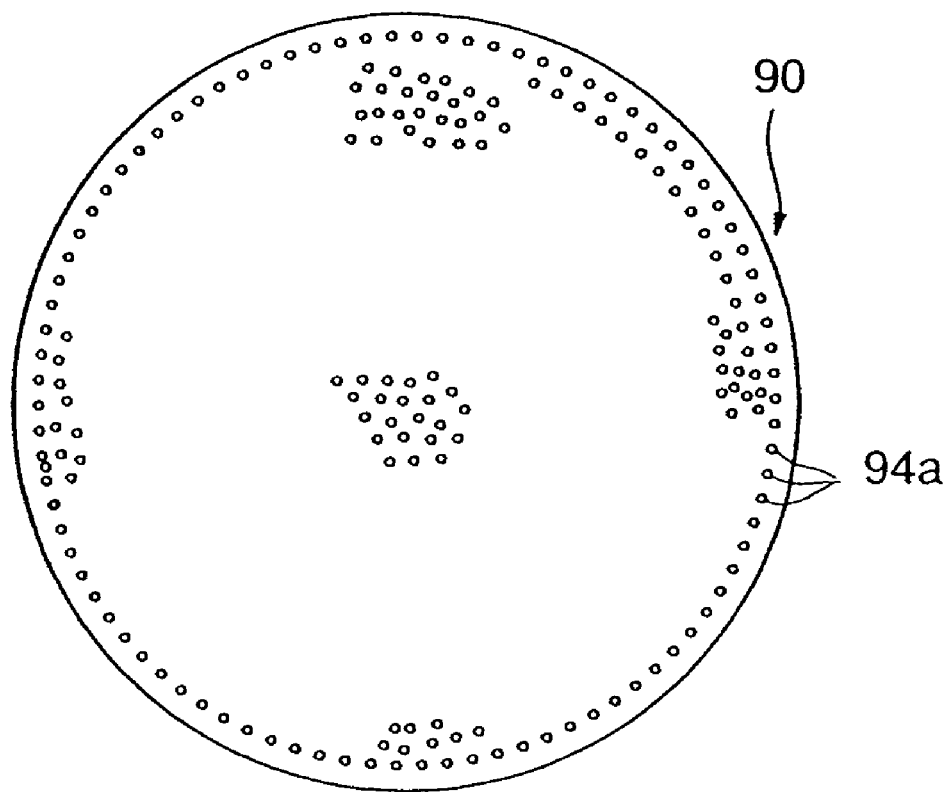
FIG. 32A is a plan view of a vacuum chuck table having many tiny holes instead of suction grooves.
Figure 32B:
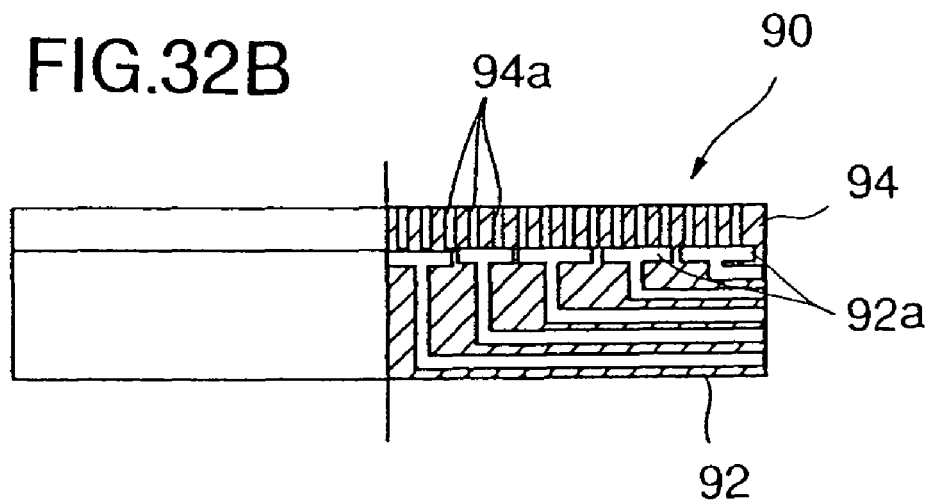
FIG. 32B is a cross-sectional view of the vacuum chuck table shown in FIG. 32A.

FIG. 32A is a plan view of a vacuum chuck table having many tiny holes instead of the suction grooves. FIG. 32B is a cross-sectional view of the vacuum chuck table shown in FIG. 32A. The vacuum chuck table 90 shown in FIGS. 32A and 32B comprises a table body 92 and a porous plate 94. A plurality of concentric grooves 92a are formed on a surface of the table body 92 on which surface the porous plate 94 is mounted. Each of the grooves 92a is connected to a vacuum source (not shown in the figure). The porous plate 94 has many holes 94a all over the surface thereof each of the holes extending through the porous plate 94. A wafer is placed on the porous plate 94, and is fixed onto the porous plate by suctioning through the holes 94a.

It should be noted that a part of the holes 94a is shown in FIG. 32A for the sake of simplification of the figure, and the holes 94a are provided all over the entire surface of the vacuum chuck table 90. The porous plate 94 may be formed of a porous material.

According to the vacuum chuck tables mentioned above, the wafer encapsulated by a seal resin can be positively fixed onto the vacuum chuck table, thereby achieving a reliable semiconductor test.

A description will now be given of treatment of a semiconductor device, which has been determined to be defective by a preliminary test (PT test) of the semiconductor device.

When the PT test is performed in the wafer state and a defective semiconductor device is found, the defective semiconductor device is treated so that solder balls are not provided to the defective semiconductor device as shown in FIG.

Figure 33:
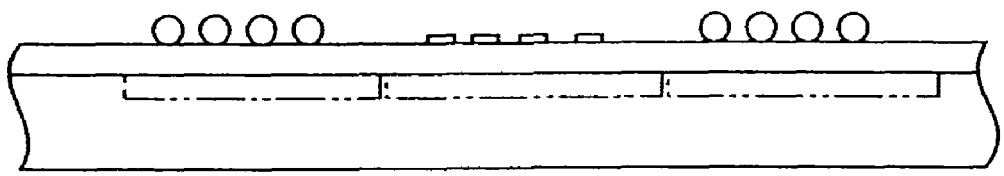
FIG. 33 is a side view of semiconductor devices formed on a wafer, one of the semiconductor devices is determined to be defective and solder balls being not provided thereto.

33. It should be noted that three semiconductor devices are shown in FIG. 33 and the semiconductor device located in the middle is the defective one.

Figure 34:
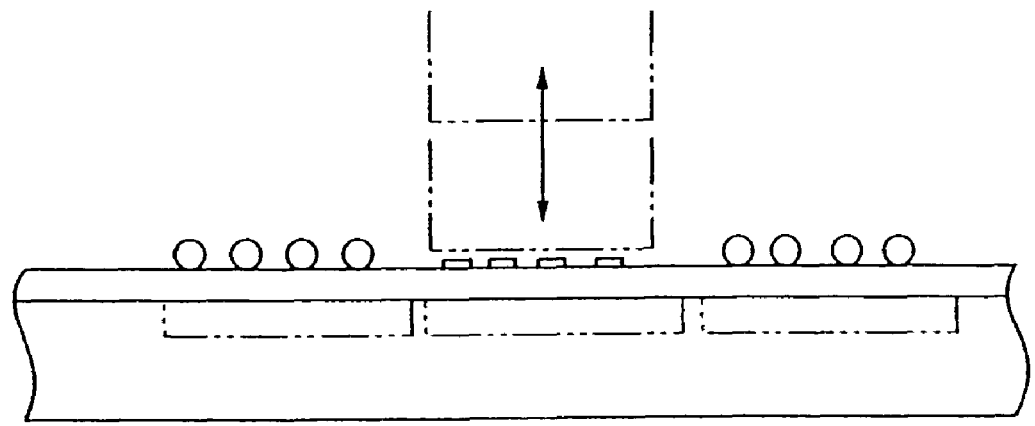
FIG. 34 is a side view of semiconductor devices formed on a wafer, one of the semiconductor devices is determined to be defective and solder balls of the defective semiconductor device being crushed.
Figure 35:
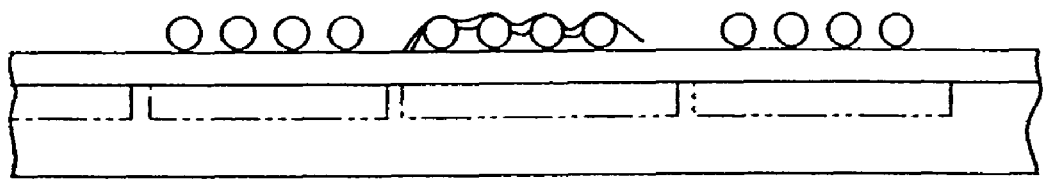
FIG. 35 is a side view of semiconductor devices formed on a wafer, one of the semiconductor devices is determined to be defective and solder balls of the defective semiconductor device being covered with an insulating material.

Instead of eliminating the formation of the solder balls on the defective semiconductor device, the solder balls are provided to the defective semiconductor device together with the normal semiconductor devices and, thereafter, the solder balls of the defective semiconductor device may be crushed or removed as shown in FIG. 34. Alternatively, as shown in FIG. 35, the solder balls on the defective semiconductor device may be covered with an insulating material such as an insulating resin.

As mentioned above, an electric contact is not made for one of the semiconductor devices when the one of the semiconductor devices is determined to be defective in the PA test. Thereby, if a DC defect occurs in one of the semiconductor devices, the probes are prevented from contacting the electrodes of the defective semiconductor device, which eliminates a problem in that an excessive current flows through the probes due to the DC defect.

The present invention is not limited to the specifically disclosed embodiments, and variations and modifications may be made without departing from the scope of the present invention.

The present application is based on Japanese priority application No. 11-321590 file on Nov. 11, 1999, the entire contents of which are hereby incorporated by reference.

What is claimed:

1. A method of testing semiconductor devices, comprising the steps of:
    forming a redistribution layer on the semiconductor devices in a wafer state;
    forming a seal resin layer on the redistribution layer so as to encapsulate the semiconductor devices;
    forming grooves in the seal resin layer along scribe lines by removing portions of the seal resin after encapsulating the semiconductor devices by the seal resin layer, the grooves extending through the seal resin layer so that an entire bottom of each of the grooves reaches the wafer and the wafer surface is exposed in the entire bottom of each of the grooves;
    performing a test on the semiconductor devices in the wafer state while recognizing the wafer exposed at an intersection of the grooves as a reference position; and
    separating the wafer into individual semiconductor devices by cutting the wafer along the scribe lines,
    wherein the forming grooves includes forming the grooves by a dicing saw to have a depth exceeding a thickness of the seal resin layer.

2. The method as claimed in claim 1, wherein the step of forming grooves includes the step of forming grooves along scribe lines selected from all of the scribe lines provided for the wafer.

* * * * *